United States Patent
Takeuchi et al.

(10) Patent No.: US 8,264,023 B2
(45) Date of Patent: Sep. 11, 2012

(54) SEMICONDUCTOR DEVICE AND MANUFACTURING METHOD OF SEMICONDUCTOR DEVICE

(75) Inventors: Yosuke Takeuchi, Kanagawa (JP);
Masamichi Matsuoka, Kanagawa (JP);
Ryoji Matsuda, Kanagawa (JP);
Keisuke Tsukamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/971,783

(22) Filed: Dec. 17, 2010

(65) Prior Publication Data

US 2011/0156181 A1 Jun. 30, 2011

(30) Foreign Application Priority Data

Dec. 25, 2009 (JP) ................................ 2009-294920

(51) Int. Cl.
*H01L 21/02* (2006.01)
(52) U.S. Cl. ...................... 257/295; 438/3; 257/E29.164
(58) Field of Classification Search ............... 438/3, 253, 438/396; 257/295, E29.164, E21.208, E21.664; 365/8, 158; 428/811
See application file for complete search history.

(56) References Cited

U.S. PATENT DOCUMENTS

| 7,252,852 B1 * | 8/2007 | Parkin ........................... 427/131 |
| 7,498,179 B2 * | 3/2009 | Song ................................. 438/3 |
| 7,528,429 B2 * | 5/2009 | Fukada ......................... 257/295 |

FOREIGN PATENT DOCUMENTS

| JP | 2003-101103 | 4/2003 |
| JP | 2003-174215 | 6/2003 |
| JP | 2003-218431 | 7/2003 |
| JP | 2003-258335 | 9/2003 |
| JP | 2003-298150 | 10/2003 |
| JP | 2003-304012 | 10/2003 |
| JP | 2003-332651 | 11/2003 |
| JP | 2004-179250 | 6/2004 |
| JP | 2007-158361 | 6/2007 |

* cited by examiner

*Primary Examiner* — Brook Kebede
(74) *Attorney, Agent, or Firm* — McDermott Will & Emery LLP

(57) ABSTRACT

A semiconductor device includes a semiconductor substrate, a lower electrode, a magnetoresistive element, an upper electrode, and a protective film. The lower electrode is formed over the semiconductor substrate. The magnetoresistive element includes a fixed layer, a tunneling insulating film, and a free layer. The upper electrode is disposed over the free layer. The protective film covers the sides intersecting the main surfaces of the lower electrode, the fixed layer, the tunneling insulating film, the free layer, and the upper electrode. The fixed layer, whose magnetization direction is fixed, is disposed over the lower electrode. The tunneling insulating film is disposed over the fixed layer. The free layer, whose magnetization direction is variable, is disposed over a main surface of the tunneling insulating film. The width of the upper electrode is smaller than that of each of the lower electrode and the fixed layer.

12 Claims, 36 Drawing Sheets

SEMICONDUCTOR DEVICE AND MANUFACTURING METHOD OF SEMICONDUCTOR DEVICE

CROSS-REFERENCE TO RELATED APPLICATIONS

The disclosure of Japanese Patent Application No. 2009-294920 filed on Dec. 25, 2009 including the specification, drawings and abstract is incorporated herein by reference in its entirety.

BACKGROUND OF THE INVENTION

The present invention relates to semiconductor devices and manufacturing methods of semiconductor devices, and more particularly, to a semiconductor device with a magnetoresistive element, and a manufacturing method of the semiconductor device.

Conventionally, a dynamic random access memory (DRAM) and a static random access memory (SRAM) are widely used as semiconductor devices, including a semiconductor integrated circuit for memory. On the other hand, a magnetic random access memory (MRAM) is a device for storing information by use of a magnetic field. The MRAM has excellent characteristics of high-speed performance, rewriting resistance, nonvolatility, and the like, as compared to other memory technologies.

The MRAM includes magnetoresistive elements referred to as a magnetic tunnel junction (MTJ) element, which uses a tunneling magnetoresistive (TMR) effect. The MRAM stores information based on the magnetization state of the magnetoresistive elements. The magnetoresistive elements are positioned in an array at intersections between digit lines extending in one direction and bit lines extending in the direction substantially perpendicular to the direction of the digit line. Each magnetoresistive element is comprised of two magnetic layers laminated with a tunneling insulating film intervening therebetween. The magnetoresistive element includes a layer whose magnetization direction is changed by a magnetic field generated by current flowing between the digit lines and the bit lines. The magnetoresistive element stores therein the magnetization direction as the information. The magnetoresistive element has its electrical resistance changed according to the magnetization direction of the layer. The change in current flowing through the magnetoresistive element is sensed based on the change in electrical resistance to thereby detect the information stored in the magnetoresistive element. A magnetic tunnel junction element disclosed in, for example, Japanese Unexamined Patent Publication No. 2007-158361 (Patent Document 1) has been hitherto proposed as one example of such a magnetoresistive element used as a magnetic sensor.

As disclosed in, for example, Japanese Unexamined Patent Publication No. 2003-332651 (Patent Document 2), a magnetoresistive effect element has a structure having an etched region from an upper electrode to an intermediate part of a barrier layer sandwiched between a free layer and a fixed layer. The region is etched so as to have a smaller superficial area intersecting in the lamination direction than that of the fixed layer located under the intermediate part of the barrier layer.

[Related Art Documents]
[Patent Documents]
[Patent Document 1]
Japanese Unexamined Patent Publication No. 2007-158361
[Patent Document 1]
Japanese Unexamined Patent Publication No. 2003-332651

SUMMARY OF THE INVENTION

In the magnetic tunnel junction element disclosed in, for example, Japanese Unexamined Patent Publication No. 2007-15836, an end of the free layer in the MRAM whose direction of magnetization is changeable is placed close to an end of the fixed layer which is magnetized substantially in the certain direction regardless of a magnetic field made by current. In this case, the magnetic field leaking from the fixed layer become noise, and may possibly cause the free layer to be magnetized in the wrong direction. When the free layer is magnetized in the wrong direction, the MRAM can misunderstand the information stored in the magnetic tunnel junction element.

A magnetoresistive effect element disclosed in Japanese Unexamined Patent Publication No. 2003-332651 has a structure in which a distance between the end of the free layer and the end of the fixed layer becomes larger. Thus, the magnetoresistive effect element reduces the possibility that the magnetic field leaking from the fixed layer will become noise and that the free layer will be magnetized in the wrong direction.

When the size control of patterning is performed on the magnetoresistive effect element with high accuracy as disclosed in Japanese Unexamined Patent Publication No. 2003-332651, variations in distance described above at the MRAM inside the semiconductor device can be reduced, thus improving the performance of the MRAM. However, when the magnetoresistive effect elements are damaged, for example, oxidized in a process for forming the magnetoresistive effect element, the magnetic fields leaking from the respective fixed layers may differs between the magnetoresistive effect elements. As a result, the free layer possibly malfunctions due to the influence of the magnetic field leaked.

Therefore, the present invention has been made so as to solve the above problems. It is an object of the present invention to provide a semiconductor device that can further suppress the leak of the magnetic field from the magnetoresistive element, and to thereby improve the performance of the semiconductor device. It is another object of the invention to provide a manufacturing method of the semiconductor device.

According to one embodiment of the invention, a semiconductor device is provided which includes a semiconductor substrate, a lower electrode, a magnetoresistive element, an upper electrode, and a protective film. The lower electrode is formed over a main surface of the semiconductor substrate. The magnetoresistive element includes a fixed layer, a tunneling insulating film, and a free layer. The upper electrode is disposed over the other main surface opposite to one main surface of the free layer opposed to the tunneling insulating film. The protective film covers sides intersecting main surfaces of the lower electrode, the fixed layer, the tunneling insulating film, the free layer, and the upper electrode. The fixed layer included in the magnetoresistive element is disposed over the one main surface of the lower electrode, and is a layer whose magnetization direction is fixed. The tunneling insulating film is disposed over the other main surface opposite to one main surface of the fixed layer opposed to the lower electrode. The free layer is disposed over the other main surface opposite to one main surface of the tunneling insulating film opposed to the fixed layer. The free layer is a layer whose magnetization direction is variable. The width of the upper electrode in the direction intersecting the lamination direction of the lower electrode, fixed layer, tunneling insulating film, free layer, and upper electrode is smaller than the width of each of the lower electrode and the fixed layer.

According to the embodiment, the end of the fixed layer of the magnetoresistive element of the semiconductor device provided is protected by the protective film. Thus, the semiconductor device has an effect of preventing the malfunction of the magnetoresistive element.

DETAILED DESCRIPTION OF THE PREFERRED EMBODIMENTS

Figure 1:
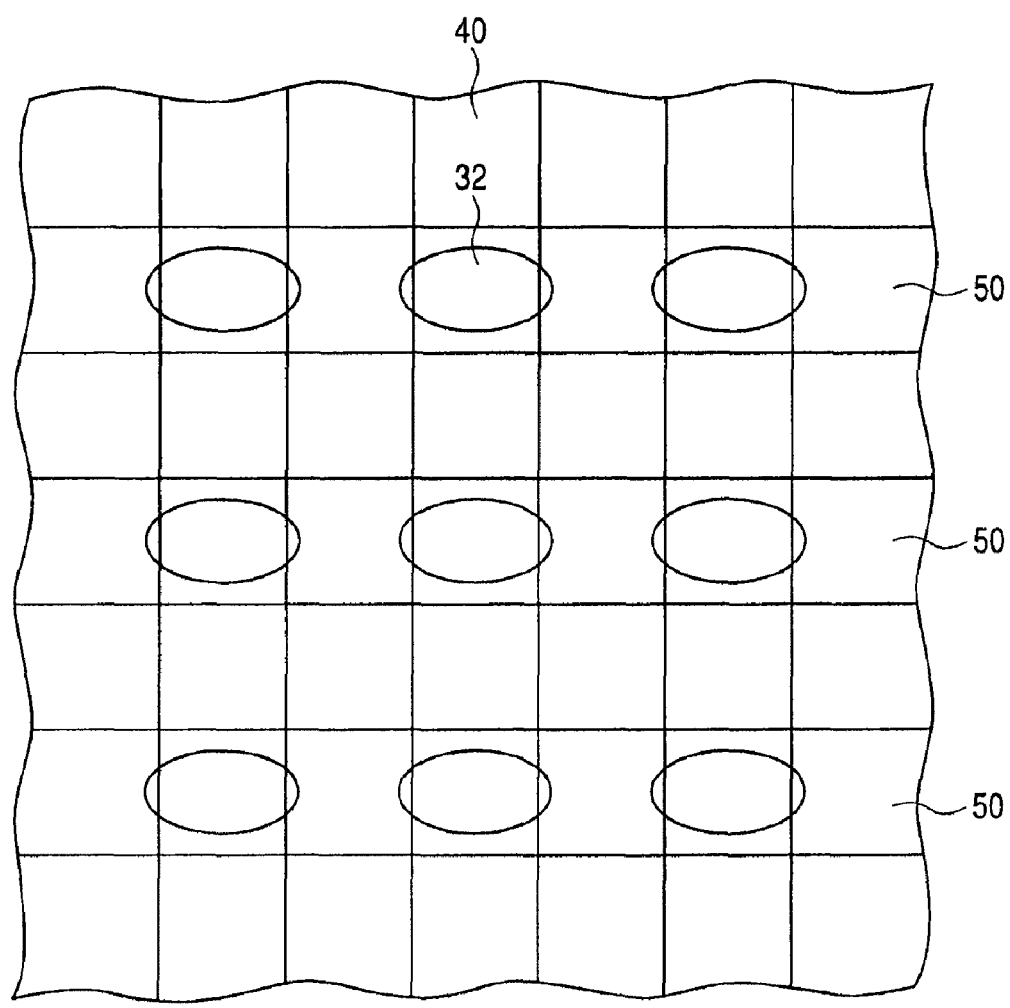
FIG. 1 is an exemplary plan view showing a semiconductor device according to one embodiment of the invention.

Now, preferred embodiments of the invention will be described below with reference to the accompanying drawings. In each embodiment, an element with the same function is designated by the same or similar reference character, and a description thereof will not be repeated unless necessary. When reference is made to the number or quantity of elements, in the following description of the embodiments, the scope of the invention is not necessarily limited to the specific number or quantity of elements unless otherwise specified. In the embodiments below, each component is not necessarily essential to the invention unless otherwise noted.

(First Embodiment)

FIG. 1 is an exemplary plan view showing a semiconductor device 200 according to a first embodiment of the invention. As shown in FIG. 1, a semiconductor substrate 100 is provided with bit lines 40 extending in one direction, digit lines 50 positioned below the bit lines 40 and formed to intersect the respective bit lines 40, and magnetoresistive elements 32, each positioned between the digit line 50 and the bit line 40, and formed in a region where the digit line 50 and the bit line 40 intersect.

The bit lines 40 extend in one direction and are formed spaced apart from each other. The digit lines 50 extend in the direction of arrangement of the bit lines 40, and are formed spaced apart from each other in the direction of extension of the bit line 40. Each magnetoresistive element 32 is provided in the corresponding region where the digit line 50 and the bit line 40 intersect.

Figure 2:
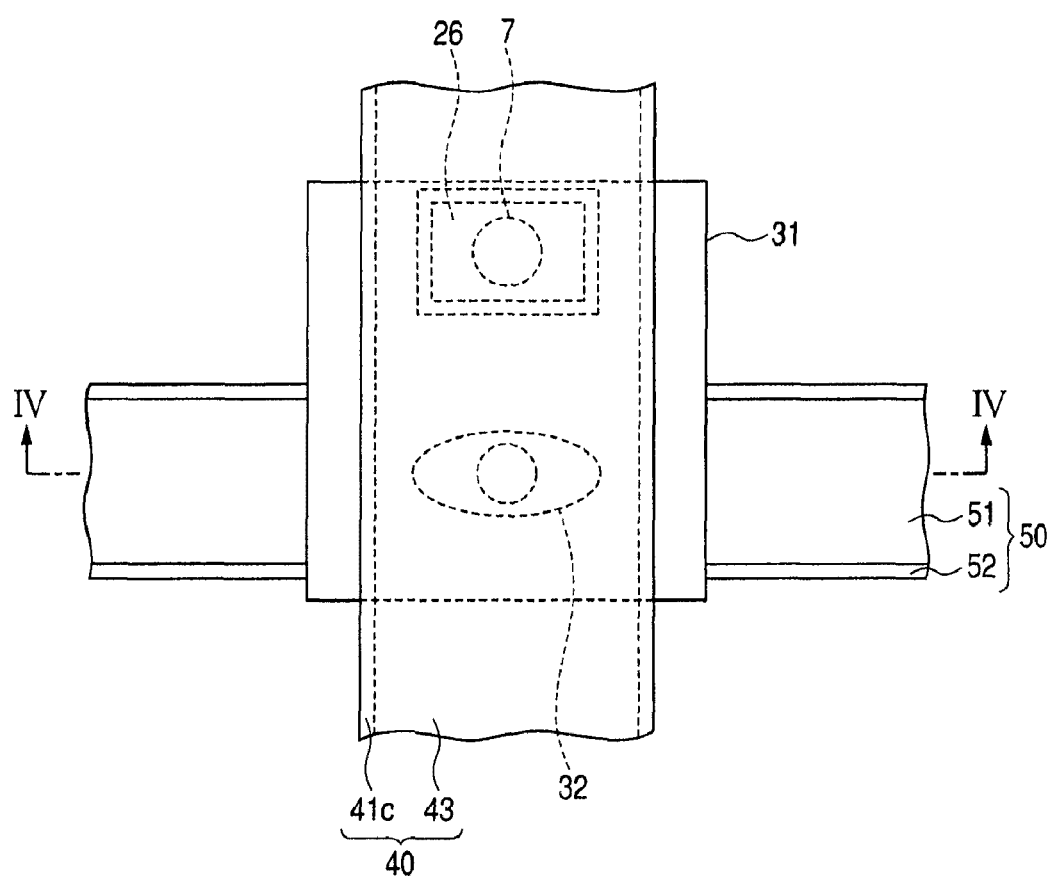
FIG. 2 is a plan view showing the magnetoresistive element shown in FIG. 1 and its surroundings.

FIG. 2 is a plan view showing the magnetoresistive element 32 and its surroundings. As shown in FIG. 2, the magnetoresistive element 32 is formed within the region where the digit line 50 and the bit line 40 intersect as viewed in a planar manner.

Figure 3:
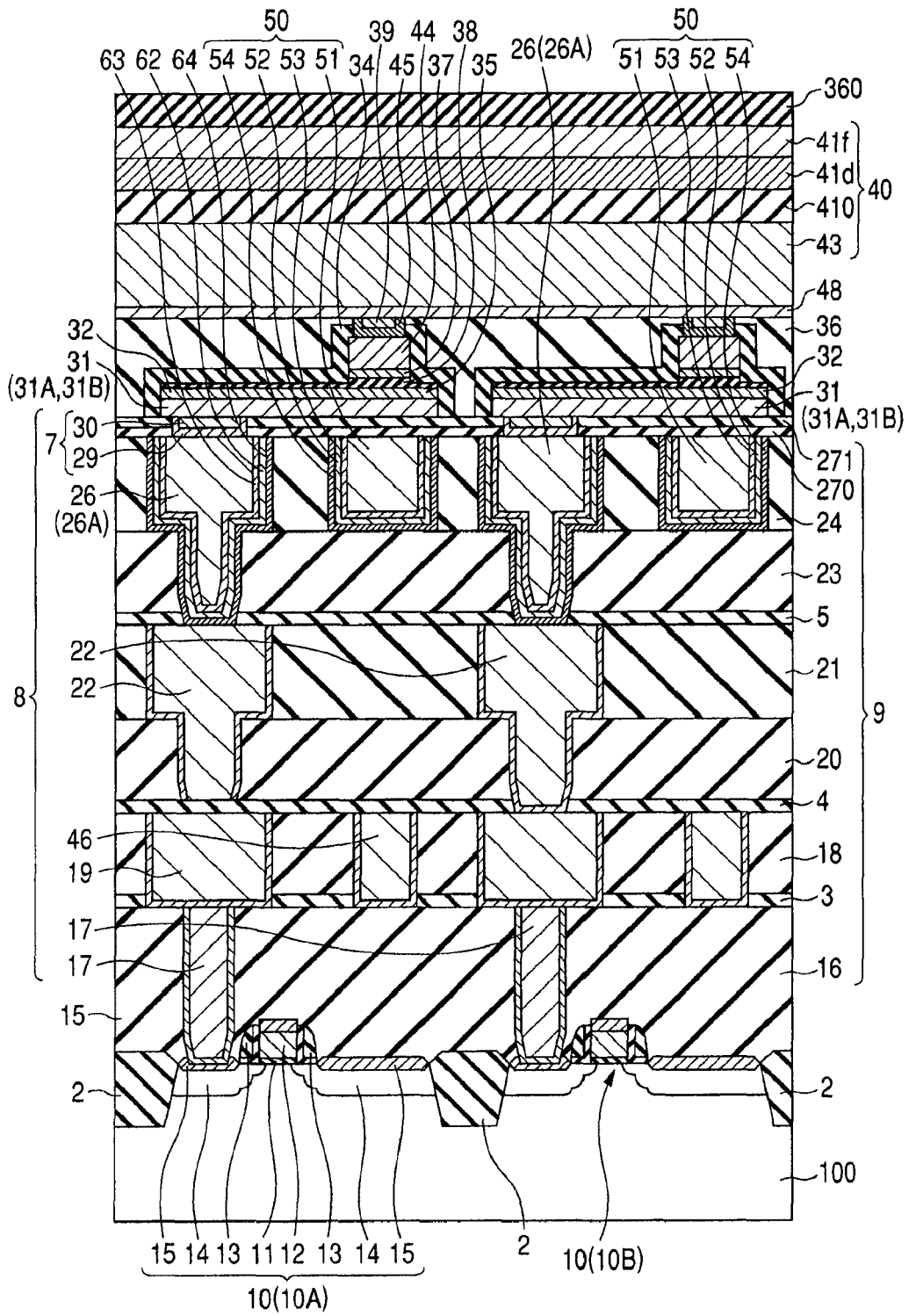
FIG. 3 is a cross-sectional view of the semiconductor device according to the embodiment.

As shown in the cross-sectional view of FIG. 3, the semiconductor device 200 includes the semiconductor substrate 100, a plurality of MOS transistors (switching elements) 10 formed over a main surface of the semiconductor substrate 100, an interlayer insulating film 9 including a plurality of insulating films formed so as to cover the MOS transistors 10 and flat insulating films 270 and 271 formed over the insulating films, and a first lower electrode 31 formed over the upper surface of the flat insulating film 271 as a leader wiring (lower electrode). As described below, the semiconductor device 200 of the first embodiment includes a second lower electrode 81 under the first lower electrode 31. However, other semiconductor devices without this second lower electrode may be used as will be described later, and thus an illustration of the second electrode will be omitted in FIG. 3.

Referring to FIG. 3, two first lower electrodes 31 are provided spaced apart from each other. The magnetoresistive element 32 is formed over the upper surface of the first lower electrode 31. The digit line 50 is positioned under the magnetoresistive element 32, and the bit line 40 is positioned above the magnetoresistive element 32.

Magnetic fields are generated around the digit lines 50 and the bit lines 40 by permitting current to flow through the digit lines 50 and the bit lines 40. The magnetic field of the digit lines 50 and the magnetic field of the bit lines 40 are merged into a combined magnetic field, which is applied to the magnetoresistive elements 32.

An isolation insulating film 2 for defining an active region is formed over the main surface of the semiconductor substrate 100. Each MOS transistor 10 is formed in the corresponding active region.

In the cross-sectional view shown in FIG. 3, the MOS transistor 10A and the MOS transistor 10B are formed spaced apart from each other.

The MOS transistor 10A includes a channel region formed over the main surface of the semiconductor substrate 100, impurity regions 14 formed on both sides of the channel region, a gate insulating film 11, and a gate electrode 12 formed over the gate insulating film 11. The MOS transistor 10A further includes sidewalls 13 formed on sides of the gate electrode 12, metal films 15 formed over the upper surfaces of the impurity regions 14, and other metal films 15 formed over the gate electrodes.

A connection wiring 8 is coupled to the impurity region 14 serving as a drain electrode, and the other impurity region 14 serves as a source electrode.

The impurity region 14 serving as the source electrode is coupled to a contact portion (not shown), which is coupled to a source wiring 46 formed in the interlayer insulating film 9. The MOS transistor 10B is formed in the same way as that of the MOS transistor 10A.

Figure 4:
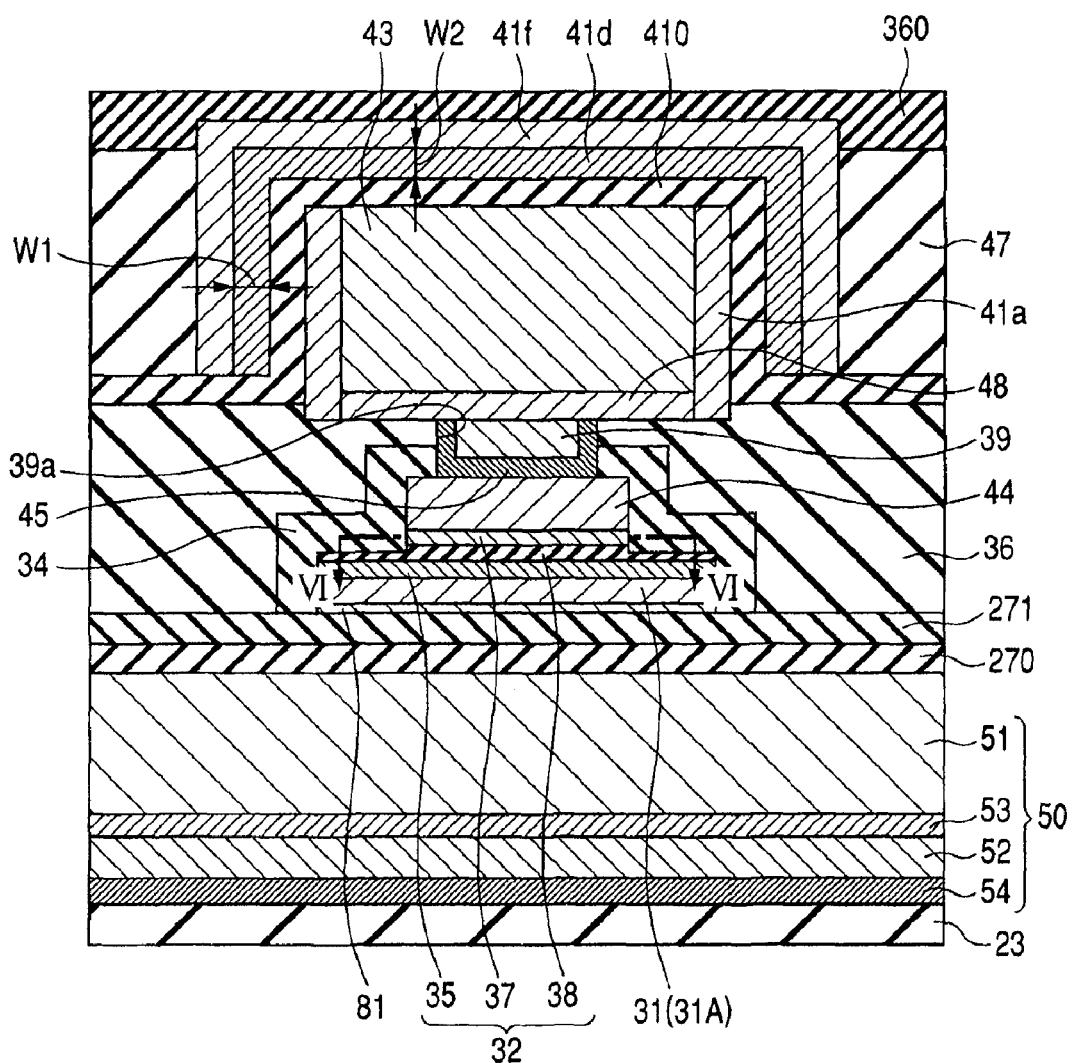
FIG. 4 is an enlarged cross-sectional view of the semiconductor device shown in FIG. 3 on the upper side from a digit line.

FIG. 4 is a cross-sectional view showing the magnetoresistive element 32 and its surroundings as viewed in the direction intersecting FIG. 3. That is, FIG. 4 is a cross-sectional view taken along the line IV-IV of FIG. 2. Referring to FIGS. 3 and 4, the magnetoresistive element 32 is formed over the main surface of one (upper side) of the first lower electrode 31 (likewise, lamination formed over the main surface of the second lower electrode 81 serving as the lower electrode) serving as the lower electrode. The magnetoresistive element 32 is formed over the first lower electrode 31, and includes a magnetization fixed layer (fixed layer) 35 formed over the first lower electrode 31 and coupled to the first lower electrode 31, a tunneling insulating film 38 formed over the magnetization fixed layer 35, and a magnetization free layer 37 (free layer) formed over the tunneling insulating film 38.

The magnetization free layer 37 has its magnetization direction changed by action of magnetic field. The magnetization fixed layer 35 has its magnetization direction fixed, which is kept constant even when the magnetic field is applied to the fixed layer from its surroundings.

The magnetoresistive element 32 is coupled to the MOS transistor 10 via the first lower electrode 31 and the connection wiring 8 as shown in FIG. 3.

A first upper electrode 44 which is a metal film is formed over the upper surface of the magnetoresistive element 32, and a contact portion 39 is formed over the upper surface of the first upper electrode 44 to be coupled to the bit line 40.

A protective film 34 is formed so as to cover the sides of the first lower electrode 31, the second lower electrode 81, the magnetoresistive element 32(magnetization fixed layer 35, tunneling insulating film 38, and magnetization free layer 37), and the first upper electrode 44. In this way, the magnetization free layer 37 of the magnetoresistive element 32 is coupled to the bit line 40.

A wiring body 43 of the bit line 40 is formed over the upper surface of a barrier metal film 48. A barrier metal film 41a is disposed to cover the sides of the wiring body 43. A liner film 410, a cladding layer 41d, and a barrier metal film 41f are sequentially arranged so as to cover the side and upper surface of a base comprised of the wiring body 43 and the barrier metal film 41a. The combination of the wiring body 43, the barrier metal film 41a, the cladding layer 41d, the barrier metal film 41f, and the liner film 410 over the side and upper surface of the wiring body 43 is defined as the bit line 40.

The width of the upper region of the first upper electrode 44, the magnetization free layer 37, and the tunneling insulating film 8 in the direction intersecting the lamination direction is smaller than that of the lower region of the first lower electrode 31, the second lower electrode 81, the magnetization fixed layer 35, and the tunneling insulating film 38. The term "width" as used herein includes both the dimension in the direction in which the bit line 40 extends (in the horizontal direction shown in FIG. 3) as shown in FIG. 3, and the dimension in the direction in which the digit line 50 extends (in the horizontal direction shown in FIG. 4) as shown in FIG. 4.

The width of the first upper electrode 44 in the direction in which the digit line 50 extends may be smaller than that of the first lower electrode 31, the second lower electrode 81, or the magnetization fixed layer 35 in the direction in which the digit line 50 extends. The width of the first upper electrode 44 in the direction in which the bit line 40 extends may be smaller than that of the first lower electrode 31, the second lower electrode 81, and the magnetization fixed layer 35 in the direction in which the bit line 40 extends. Alternatively, the width of the upper region of the first upper electrode 44, the magnetization free layer 37, and the tunneling insulating film 38 only in the direction in which one of the above digit line 50 and the bit line 40 extends may be smaller than that of the lower region under them.

Suitable materials and sizes of the respective components as described above will be described below. The lower electrode preferably includes Ta (tantalum), TaN (tantalum nitride), Ru (ruthenium), or TiN (titanium nitride). In the first embodiment, for example, the second lower electrode 81 on the lower side is preferably comprised of Ru, and the first lower electrode 31 on the upper side is preferably comprised of Ta or TaN. In this way, the first lower electrode 31 and the second lower electrode 81 are preferably comprised of material having high etching selectivity to each other. The term "high etching selectivity to each other" as used herein means a large difference in etching rate between the materials forming both the first and second lower electrodes.

The thickness of the second lower electrode 81 is preferably not less than 1.0 nm nor more than 9.0 nm. The thickness of the first lower electrode 31 is preferably not less than 20 nm nor more than 50 nm, and more preferably not less than 25 nm nor more than 40 nm.

As shown in FIGS. 3 and 4, the magnetization fixed layer 35 is illustrated as one layer. However, the magnetization fixed layer 35 generally used is comprised of a double-layered structure including a ferromagnetic layer laminated on an antiferromagnetic layer, or a four-layered structure or five-layered structure including a ferromagnetic layer, a nonmagnetic layer, and another ferromagnetic layer laminated on an antiferromagnetic layer in that order. It is noted that the number of laminated layers or the order of the lamination is not limited thereto.

Figure 5:
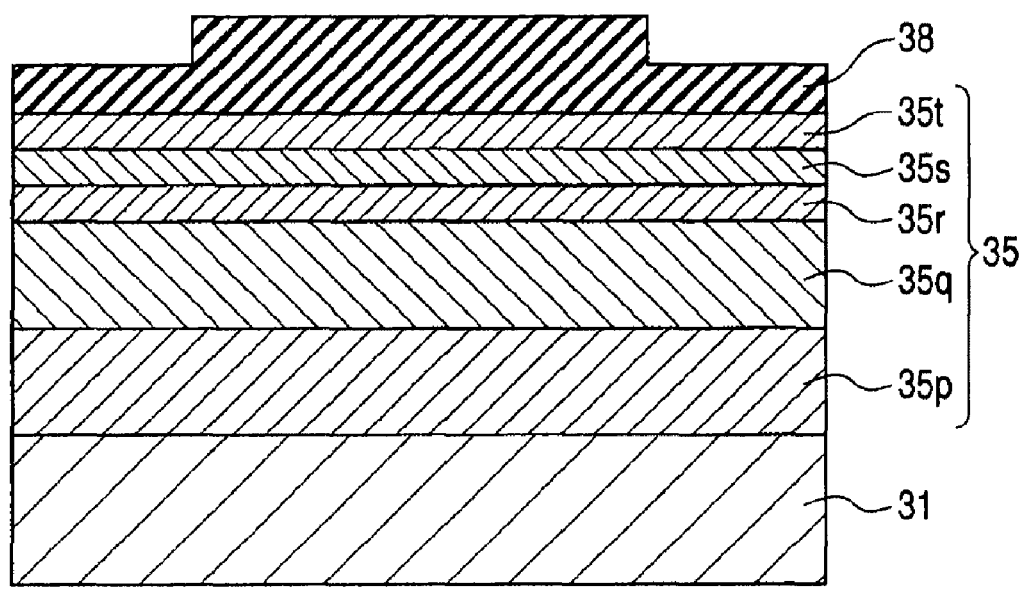
FIG. 5 is a cross-sectional view showing one example of a laminated structure included in a magnetization fixed layer.

For example, as shown in FIG. 5, when the magnetization fixed layer 35 is comprised of the five-layered structure, a seed layer 35p, an antiferromagnetic layer 35q, a ferromagnetic layer 35r, a nonmagnetic layer 35s, and a ferromagnetic layer 35t are preferably laminated from the bottom in that order.

The seed layer 35p is preferably a metal film comprised of an alloy of Fe (iron), and Ta, Ru, or Ni (nickel). Alternatively, the seed layer 35p may be preferably a metal film comprised of an alloy of Ni, Fe, and Cr (chrome). Further, the metal films made of various alloys described above may be laminated to form the seed layer 35p. The entire thickness of the seed layer 35p is preferably not less than 0.5 nm nor more than 10 nm, and more preferably not less than 1.0 nm nor more than 8.5 nm.

The antiferromagnetic layer 35q is preferably a metal film comprised of an alloy of Pt (platinum) and Mn (manganese), an alloy of Ir (iridium) and Mn (manganese), or an alloy of Ru and Mn. The thickness of the antiferromagnetic layer 35q is preferably not less than 10 nm nor more than 30 nm, and more preferably not less than 12 nm nor more than 25 nm.

The ferromagnetic layer 35r is preferably a film made of a single metal or an alloy comprised of one or more kinds of elements selected from the group consisting of Ni, Co (cobalt), Fe, and B (boron). Alternatively, the ferromagnetic layer may be a lamination of alloy layers formed of a combination of the materials described above. The entire thickness of the ferromagnetic layer 35r is preferably not less than 1.2 nm nor more than 3.0 nm, and more preferably not less than 1.5 nm nor more than 2.5 nm.

The nonmagnetic layer 35s is preferably a metal film comprised of Ru, and having a thickness of not less than 0.4 nm nor more than 1.0 nm. The nonmagnetic layer 35s more preferably has a thickness of not less than 0.6 nm nor more than 0.9 nm.

Further, the ferromagnetic layer 35t is preferably made of the same material as that of the ferromagnetic layer 35r. The ferromagnetic layer 35t preferably has such a thickness that provides substantially the same magnetization amount as that of the ferromagnetic layer 35r.

The tunneling insulating film 38 is preferably an insulating film comprised of any one of $AlO_x$ (aluminum oxide), MgO (magnesium oxide), and HfO (hafnium oxide). The tunneling insulating film 38 has a thickness not less than 0.5 nm nor more than 2.0 nm, and more preferably, not less than 0.6 nm nor more than 1.5 nm.

The magnetic free layer 37 is preferably a thin film comprised of a ferromagnetic layer. Specifically, the magnetic free layer 37 is preferably a film made of a single metal or an alloy comprised of one or more kinds of elements selected from the group consisting of Ni, Co, Fe, B, and Ru. The magnetization free layer 37 may be comprised of thin films made of the above different alloys. The magnetic free layer 37 preferably has an entire thickness not less than 2.0 nm nor more than 10 nm, and more preferably, not less than 3.0 nm nor more than 9.0 nm.

Further, the first upper electrode 44 is preferably comprised of the same material as that of the first lower electrode 31. Specifically, the first upper electrode 44 is preferably comprised of Ta or TaN. The term "same material" as used herein includes the form of the same kind of material contained as a principle component such that the etching selectivity between the first upper electrode 44 and the first lower electrode 31 is lowered. The first upper electrode preferably has a thickness of not less than 30 nm nor more than 70 nm, and more preferably, not less than 35 nm nor more than 65 nm.

The thin films forming the outer peripheral portion of the wiring body 43 of the bit line 40 in use are preferably a nonmagnetic tantalum thin film as the barrier metal films 48, 41a, and 41f, or a thin film made of TaN (tantalum nitride) with nitrogen added thereinto. The cladding layer 41d is preferably formed using soft magnetic material with high permeability and very low remanent magnetization. Specifically, an alloy or an amorphous alloy, such as NiFe (nickel iron), NiFeMo, CoNbZr (cobalt niobium zirconium), CoFeNb, CoFeSiB, CoNbRu, CoNbZrMoCr, or CoZrCrMo, is preferably used. A liner film 410 is disposed so as to couple the adjacent bit lines 40 with respect to the horizontal direction shown in FIG. 4. Thus, unlike the above barrier metal films 41a, 41f, and 48, the liner film 410 is preferably comprised of dielectric (insulating) material, such as SiN, SiC, SiON, or SiOC.

Now, the operation principle of the semiconductor device 200 with the above structure will be described below. When current flows through the digit lines 50 (wiring body 51) and the bit lines (wiring body 43), the magnetization free layers 37 of all magnetoresistive elements 32 along the digit lines and the bit lines have the magnetization direction changed. In a case where the current flowing through the digit lines 50 and the bit lines 40 (or magnetic field generated by the current) is smaller than the current required for inversion of the magnetization direction, after the current is turned off, the magnetization direction of the magnetization free layer 37 of each of all magnetoresistive elements 32 along the digit lines 50 and the bit lines 40 is returned to the original state before the current flows. This means that the magnetic field generated by the current is smaller than the magnetic field required for inversion of the magnetization direction of the magnetization free layer 37. In a case where the current is larger than the current required for inversion of the magnetization direction of the magnetization free layer 37, after the current is turned off, the magnetization direction of the magnetization free layer 37 of each of all magnetoresistive elements 32 along the digit lines 50 and bit lines 40 is inverted. This means that the magnetic field generated by the current is larger than the magnetic field required for inversion of the magnetization direction of the magnetization free layer 37.

By use of the above properties, first, a current (first current) smaller than the current required for inversion of the magnetization direction of the magnetization free layer 37 is allowed to pass through either the digit line 50 or bit line 40. Then, in this state, an appropriate current (second current) is allowed to flow through the other of the digit line 50 and the bit line 40 described above.

The term "appropriate current" as used herein means a current value required to increase a combined magnetic field resulting from the first and second currents only at regions where the wirings for the first current and for the second current intersect each other as described above, as compared to the magnetic field required for inversion of the magnetization direction of the magnetization free layer 37 of the magnetoresistive element 32.

This arrangement inverts the magnetization direction of the magnetization free layer 37 only of the magnetoresistive element 32 located in the region of intersection of the digit line 50 and bit line 40 for permitting the current to flow therethrough to thereby rewrite data. That is, in rewriting the data, selection of the magnetoresistive element 32 for rewriting the data, and rewriting by the magnetoresistive element 32 are simultaneously performed.

Specifically, the magnetization direction of the magnetization free layer 37 is the same as that of the magnetization fixed layer 35, or is opposite to that of the magnetization fixed layer 35. The electrical resistance of the magnetoresistive element 32 differs between when the magnetization direction of the magnetization free layer 37 is identical to that of the magnetization fixed layer 35, and when the magnetization direction of the free layer 37 is opposite to that of the fixed layer 35. The difference in resistance is used as information of "0" or "1".

When reading the information from the selected magnetoresistive element 32, the MOS transistor 10 coupled to the selected magnetoresistive element 32 is turned ON.

A voltage is applied through the MOS transistor 10 and the bit lines 40, and a resistance of the selected magnetoresistive element 32 is detected, so that electrical information stored in the magnetoresistive element 32 can be read out. The electrical information is transferred to an external load, for example, through electrode pads arranged in surroundings (not shown) of the magnetoresistive elements 32 of the semiconductor device 200.

The cladding lay 41d is arranged to enclose the sides and upper portions of the wiring body 43 such that the magnetic field generated by the current flowing through the bit lines 40 concentrates on the magnetic free layer 37 of the magnetoresistive element 32. Thus, the magnetic field generated by the current flowing through the bit lines 40 (wiring bodies 43) concentrates on the inside of the cladding layer 41d. This is due to the magnetic shield effect of the cladding layer 41d having a high magnetic permeability.

Thus, the magnetic field can concentrate on the magnetic free layer 37 of the magnetoresistive element 32 directly under the bit line. The cladding layer 41d located on the sides of the wiring body 43 and the cladding layer 41d located above the wiring body 43 are coupled to each other at an upper end of the cladding layer 41d on each side. That is, the cladding layer 41d on the side of the wiring body 43 is coupled to the cladding layer 41d above the wiring body 43. This arrangement can reduce the possibility of leakage of the magnetic field flowing from a cut portion of the cladding layer 41d into the adjacent magnetoresistive element 32 through the inside of the cladding layer 41d.

The thickness of the cladding layer 41d is preferably set such that the thickness W1 of the cladding layer 41d on the side of the wiring body 43 shown in FIG. 4 is larger than the thickness W2 of the cladding layer 41d above the wiring body 43. The leakage of the magnetic field toward the adjacent magnetoresistive element 32 tends to occur the side of the magnetoresistive element 32 or wiring body 43 rather than the upper portion thereof. Thus, by thickening the cladding layer 41d on the side of the wiring body 43, the magnetic shield effect of the cladding layer 41d is enhanced, which can more surely suppress the leakage of the magnetic field. That is, this arrangement can suppress the malfunction of the semiconductor device due to the magnetic field leaked into a magnetoresistive element 32 adjacent to the magnetoresistive element 32.

Even when the thickness W2 is not so large as the thickness W1, the wrong information into the magnetoresistive element 32 of the adjacent memory unit is hardly written. Otherwise, the thickness W2 is preferably smaller than the thickness W1. By decreasing the thickness W2, the controllability of the form of the cladding layer 41d in the processing can be improved. Thus, variations in current for writing information in between the bit lines 40 and the digit lines 50 (variations in magnetic field generated) can be suppressed.

Specifically, the thickness W1 is preferably not less than 10 nm nor more than 30 nm, and more preferably, not less than 15 nm nor more than 25 nm. The thickness W2 is preferably not less than 5 nm nor more than 20 nm, and more preferably, not less than 10 nm nor more than 15 nm.

The barrier metal film 41a and the liner film 410 on the upper surface of the wiring body 43 are arranged to be sandwiched between the wiring body 43 and the cladding layer 41d so as to suppress interdiffusion, for example, between copper atoms contained in the wiring body 43 and metal atoms contained in the cladding layer 41d. The barrier metal film 41f is arranged to be sandwiched between insulating layers 47 and 360 and the cladding layer 41d so as to suppress interdiffusion, for example, between silicon atoms contained in the insulating layers 47 and 360 directly coupled thereto, and metal atoms contained in the cladding layer 41d.

In order to sufficiently exhibit the effect of suppressing such interdiffusion, the barrier metal films 41a and 41b preferably have a thickness of not less than 3 nm nor more than 25 nm, and more preferably not less than 10 nm nor more than 20 nm. When the thickness of the barrier metal films 41a and 41f is larger than the above range, a region enclosed by the barrier metal films becomes small, which leads to a decreased cross-sectional area of the wiring body 43. As a result, the resistance of current flowing through the wiring body 43 possibly becomes large. Accordingly, the thickness of the barrier metal film is preferably in the above range.

The thickness of the liner film 410 is preferably not less than 10 nm nor more than 80 nm, and more preferably, not less than 40 nm nor more than 70 nm. When the thickness is smaller than the above lower limit value, the quality of a copper wiring of the wiring body 43 is degraded, which can reduce the reliability of the wiring. When the thickness is larger than the above upper limit value, a region occupied by the liner film 410 is widened, which possibly makes it difficult to process the thin film. Accordingly, the thickness of the liner film 410 is preferably in the above range.

In order to read the change in electrical resistance of the magnetoresistive element 32 according to the change in direction of magnetization within the magnetization free layer 37 with high accuracy, the magnetization direction is preferably the same over any other regions of the magnetization free layer 37. The structure having no difference in magnetization direction inside the magnetization free layer 37 is hereinafter referred to as a single magnetic domain structure, and the structure having a difference in magnetization direction between internal regions thereof is hereinafter referred to as a multi-magnetic domain structure. By maximizing the change in resistance of the magnetoresistive element 32 in response to the change in magnetization direction of the magnetization free layer 37, the operation of the magnetoresistive element 32 is more stabilized. For this reason, the magnetization free layer 37 and the magnetization fixed layer 35 preferably take the single magnetic domain structure.

Figure 6A:
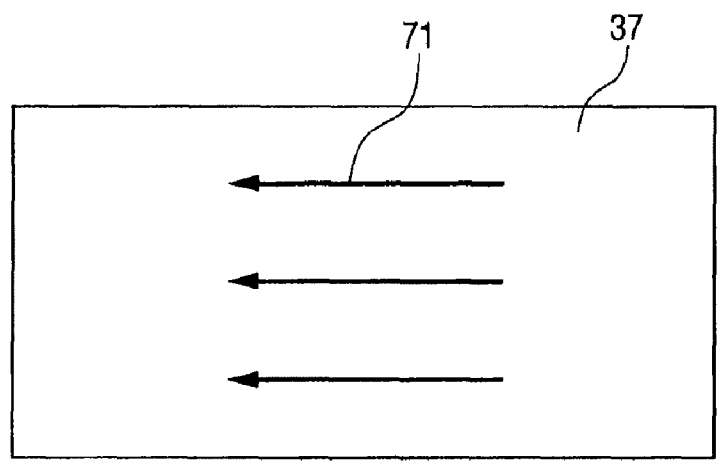
FIG. 6A is a schematic diagram showing the state of a single magnetic domain structure of the magnetization fixed layer.
Figure 6B:
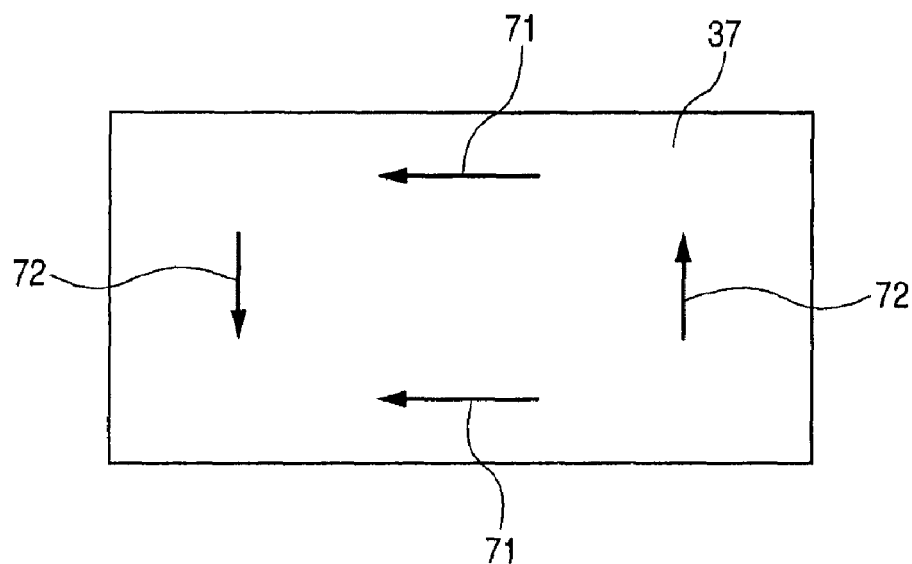
FIG. 6B is a schematic diagram showing the state of a multi-magnetic domain structure of the magnetization fixed layer.

FIGS. 6A and 6B are cross-sectional views taken along the line VI-VI of FIG. 4, showing the magnetization directions by arrows in respective regions inside the magnetization fixed layer 35. As indicated by a line of magnetic force 71 in FIG. 6A, suppose that the magnetization direction of the magnetization free layer 37 is directed leftward with respect to the paper surface. At this time, for example, when a magnetic field leaks from the end of the magnetization fixed layer 35 under the magnetization free layer 37 and acts on the magnetization free layer 37, not only the line of magnetic force 71, but also a line of magnetic force 72 having a magnetization direction different from that of the line 71 is generated in the magnetization free layer 37 as shown in FIG. 6B. The magnetization free layer 37 becomes a multi-magnetic domain structure, which leads to a small change in resistance of the magnetoresistive element 32. As a result, the operation of the magnetoresistive element 32 is possibly unstable.

To suppress this tendency, the region above the first upper electrode 44, the magnetization free layer 37, and the tunneling insulating film 38 has a smaller width in the direction intersecting the lamination direction than that of the region under the first lower electrode 31, the second lower electrode 81, the magnetization fixed layer 35, and the tunneling insulating film 38. In this way, the length between the respective ends in the width direction of the magnetization fixed layer 35 and the magnetization free layer 37 can be increased to thereby suppress interference of the magnetic field of the magnetization fixed layer 35 on the magnetization free layer 37.

In some cases, however, the writing of wrong information onto the magnetization free layer 37 cannot be suppressed only by controlling the size of each layer. For example, when an insulating film disposed to cover the surrounding of the layers included in the magnetoresistive element 32 is a silicon oxide film, the magnetization free layer 37 will be oxidized in contact with the oxide film. By the oxidation, the magnetic field inside the magnetic free layer 37 is changed to be trapped in the magnetization free layer 37. As shown in FIG. 6B, a line of magnetic force, such as the line of magnetic force 72, may be generated.

For this reason, the protective film 34 is formed to cover the sides of the magnetoresistive element 32 including the magnetization free layer 37, the first upper electrode 44, and the lower electrode (first lower electrode 31 and second lower electrode 81). The protective film 34 is preferably comprised of a nitride insulating film made of, for example, SiN. The protective film 34 may be comprised of, for example, SiC (carbon silicate), instead of SiN, or any other insulating material not containing oxygen.

When the nitride insulating film suppresses oxidization of the magnetization free layer 37 and the magnetization fixed layer 35, these layers can have the single magnetic domain structure. Thus, the change in resistance of the magnetoresistive element 32 can be maximized to enhance the stability of the operation of the magnetoresistive element 32.

The arrangement of the protective film 34 suppresses the leakage of the magnetic field from the magnetization free layer 35 into the magnetization free layer 37. This can enhance the stability of the operation of the magnetoresistive element 32.

In the semiconductor device 200 of the first embodiment, the lower electrode is comprised of two-layered lamination of the first lower electrode 31 and the second lower electrode 81. When the lower electrode is a lamination of a plurality of layers, the corresponding thickness of each of the first lower electrode 31 and the second lower electrode 81 is small as compared to that of the lower electrode comprised of only one layer. The thickness of each layer included in the lower electrode is made small, so that each layer tends to be formed in an amorphous form without crystallization. In this way, the respective layers of the lower electrode are converted into an amorphous form, and can have the surfaces thereof more planarized. Thus, when forming the magnetization fixed layer 35 to be formed on an upper surface of the lower electrode (first lower electrode 31), for example, the growing of the lowermost seed layer can be controlled with ease. In this way, for example, the growth of the seed layer can be controlled with high accuracy, which can suppress variations in crystalline orientation of the inside of the antiferromagnetic layer following the seed layer in forming the magnetization fixed layer 35.

Next, a manufacturing method of the semiconductor device 200 described above will be described below. The semiconductor device 200 is formed mainly by performing respective steps shown in the flowchart of FIG. 7.

First, a base wiring is prepared (in step S00). Specifically, this step includes the steps of preparing a semiconductor substrate having a main surface, and forming a base circuit for forming the magnetoresistive elements 32 over the main surface of the semiconductor substrate.

Figure 8:
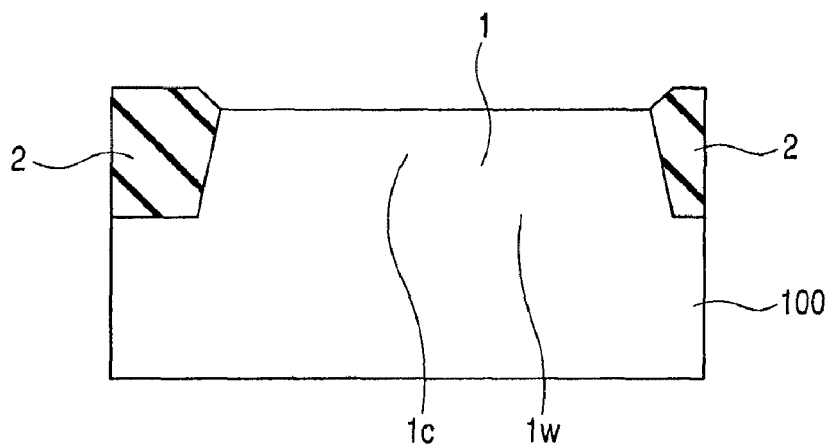
FIG. 8 is a cross-sectional view showing a first step of a manufacturing step of the semiconductor device according to the embodiment.

FIGS. 8 to 15, and FIGS. 17 to 21 are cross-sectional views showing the forms of the respective processes as viewed in the same direction as that of FIG. 3. As shown in FIG. 8, the semiconductor substrate 100 with the main surface is prepared. The isolation insulating film 2 is formed over the main surface of the semiconductor substrate 100. The active region 1 is formed over the main surface of the semiconductor substrate 100 by the isolation insulating film 2.

Then, impurities are introduced into the active region by ion implantation or the like to sequentially form a well region 1w and a channel region 1c.

Figure 9:
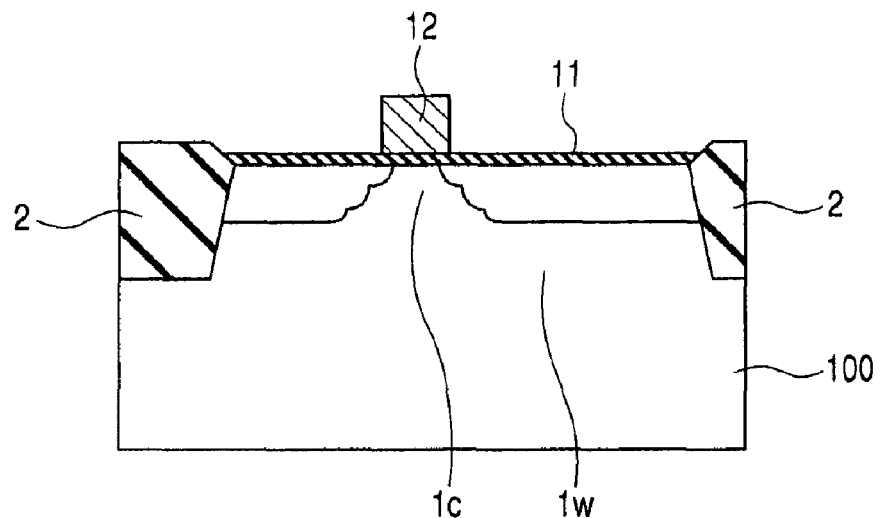
FIG. 9 is a cross-sectional view showing a manufacturing step after the manufacturing step shown in FIG. 8.

As shown in FIG. 9, a gate insulating film 11 is formed over the main surface of the channel region 1c by the thermal oxidation. Thereafter, a polycrystalline silicon film or the like is deposited and patterned to form a gate electrode 12 on the gate insulating film 11.

Figure 10:
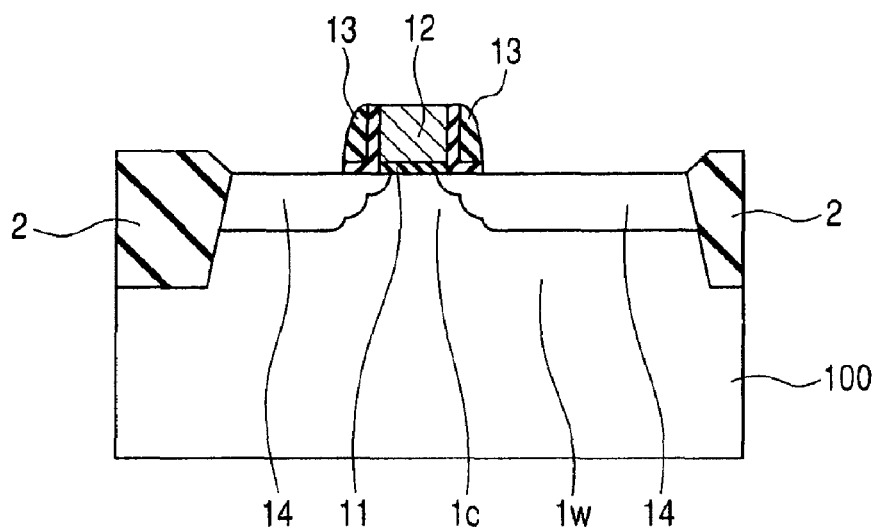
FIG. 10 is a cross-sectional view showing a manufacturing step after the manufacturing step shown in FIG. 9.

Then, as shown in FIG. 10, impurities of a predetermined conductive type are introduced into the active region 1 using the gate electrode 12 as a mask. Further, an insulating film, such as a silicon oxide film, is formed over the sides of the gate electrode 12. After forming the insulating films, impurities are introduced again into the active region 1.

After introducing the impurities twice, an insulating film, such as a silicon oxide film or a silicon nitride film, is deposited. The deposited insulating film is dry-etched to form the sidewalls 13. After forming the sidewalls 13, impurities are introduced again into the channel region 1c. Thus, impurity regions 14 serving as a source or drain are formed.

Figure 11:
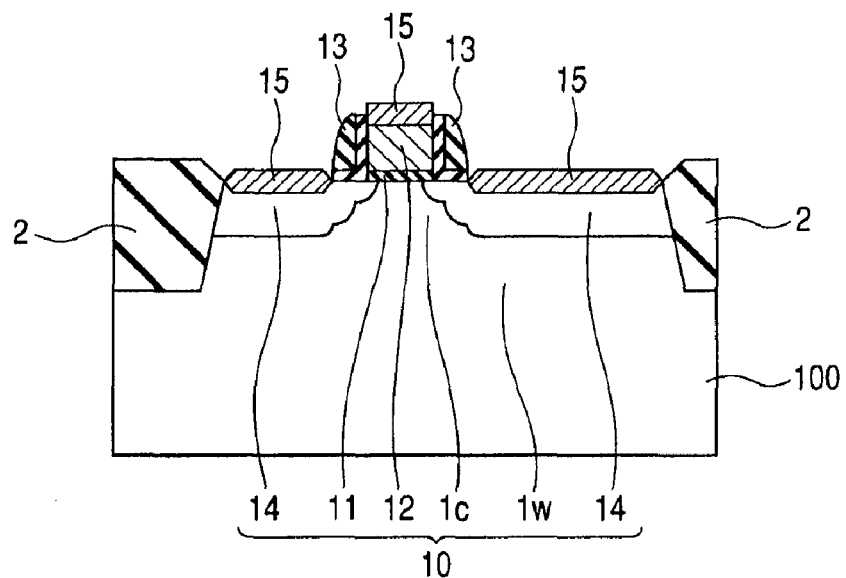
FIG. 11 is a cross-sectional view showing a manufacturing step after the manufacturing step shown in FIG. 10.

As shown in FIG. 11, a metal film is deposited by spattering and then patterned to thereby form the metal film 15 on the upper surface of impurity region 14 and the upper surface of the gate electrode 12. As a result, a MOS transistor 10 is formed.

Figure 12:
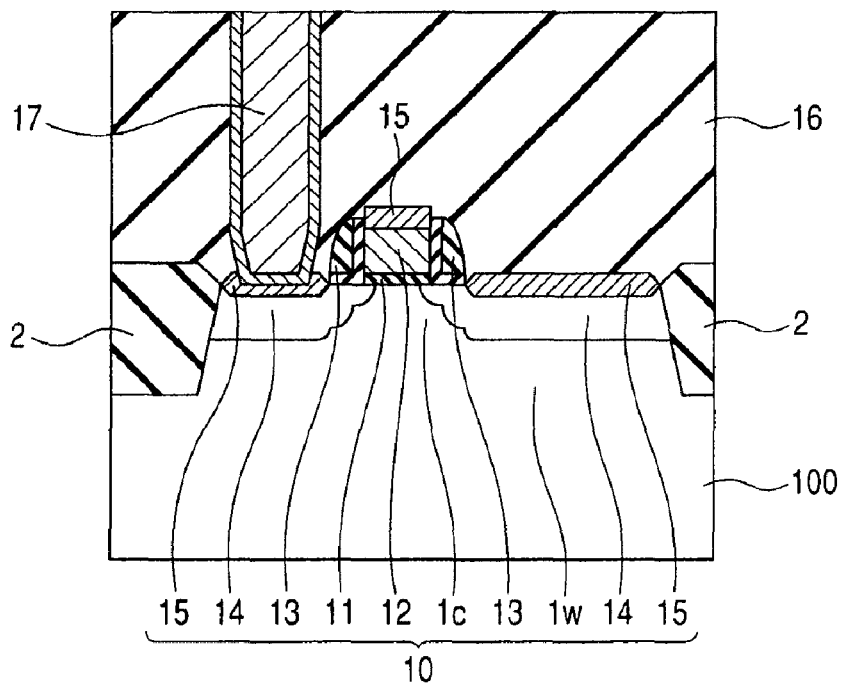
FIG. 12 is a cross-sectional view showing a manufacturing step after the manufacturing step shown in FIG. 11.

As shown in FIG. 12, after forming the MOS transistor 10, for example, an insulating film 16 formed of a silicon oxide film or the like is formed so as to cover the MOS transistor 10.

The formed insulating film 16 is subjected to lithography and etching to form a contact hole. The contact hole is formed to reach the metal film 15 formed over the impurity region 14.

Thereafter, a barrier metal film is formed over an inner surface of the contact hole by sputtering or the like. After forming the barrier metal film, the contact hole is filled with a conductive film made of copper or the like, and the conductive film is subjected to a chemical mechanical polishing (CMP) process to form a unit contact 17.

Figure 13:
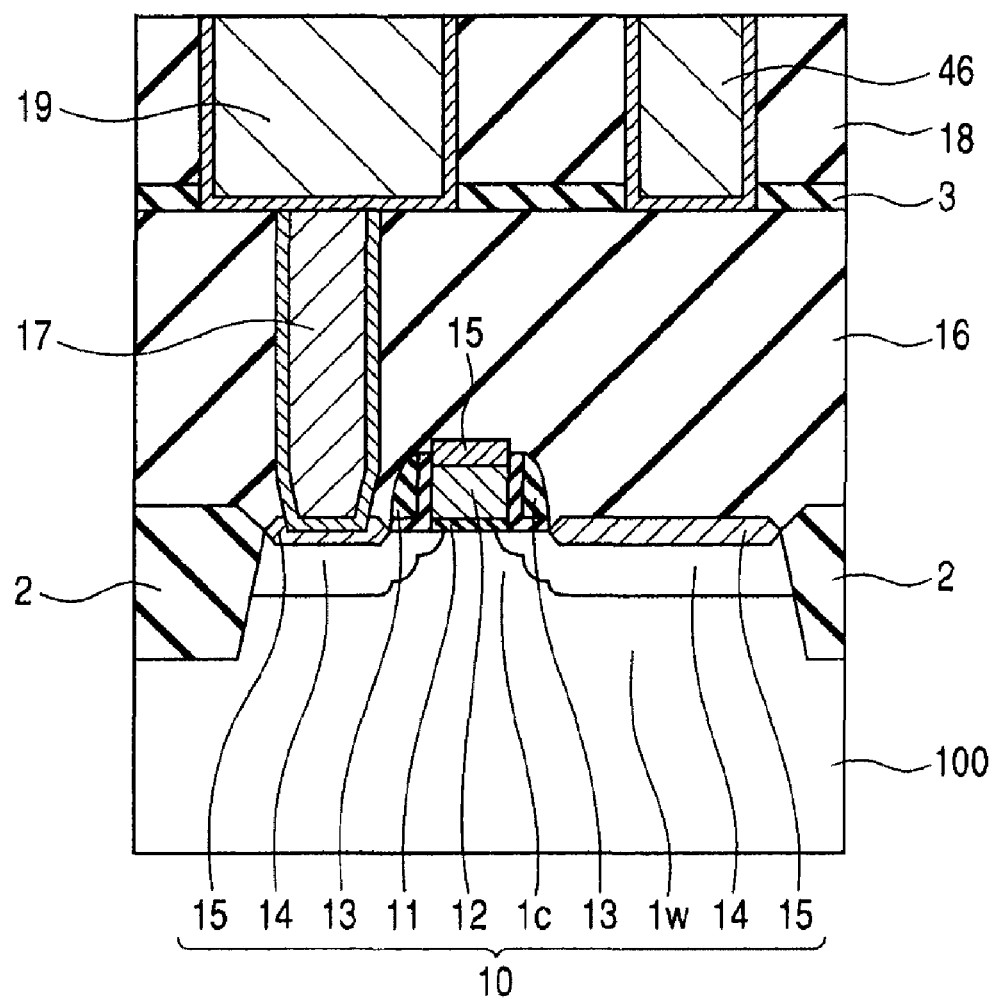
FIG. 13 is a cross-sectional view showing a manufacturing step after the manufacturing step shown in FIG. 12.

As shown in FIG. 13, the insulating film 3 and the insulating layer 18 are formed over the upper surface of the insulating layer 16 in that order. Then, a groove is formed in the insulating layer 18 and the insulating film 3. A barrier metal film is formed in the formed groove, so that the groove is filled with a conductive film. The conductive film is planarized, whereby the unit contact 19 and the source wiring 46 are formed in the insulating layer 18 and the insulating film 3.

Figure 14:
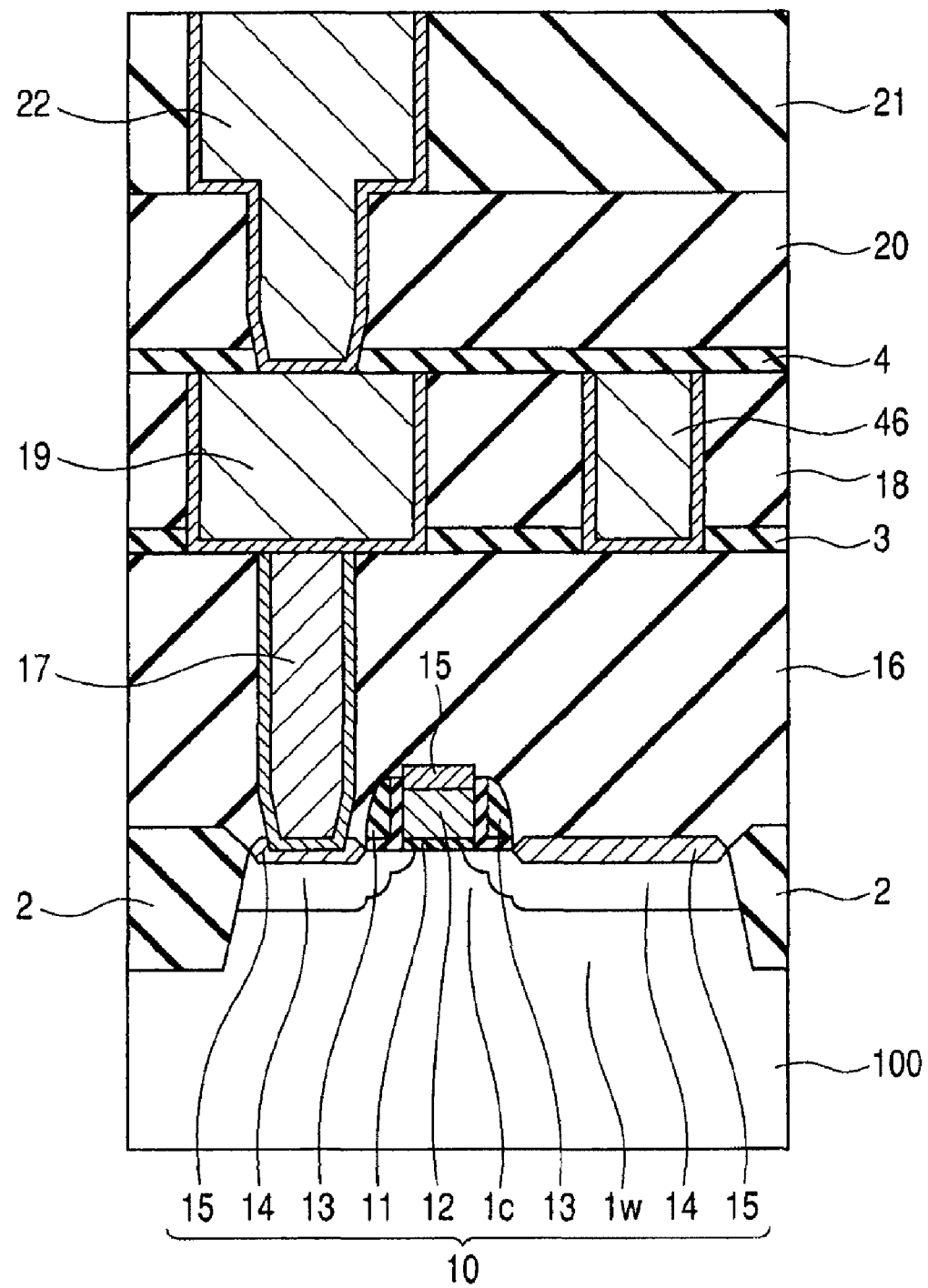
FIG. 14 is a cross-sectional view showing a manufacturing step after the manufacturing step shown in FIG. 13.

Then, as shown in FIG. 14, the insulating film 4, and the insulating layers 20 and 21 are formed in that order. Thereafter, a hole is formed in the insulating films 4, 20, and 21, and a barrier metal film is formed over the inner surface of the hole. A conductive film is covered over the barrier metal film, and then planarized to thereby form a unit contact 22.

Figure 15:
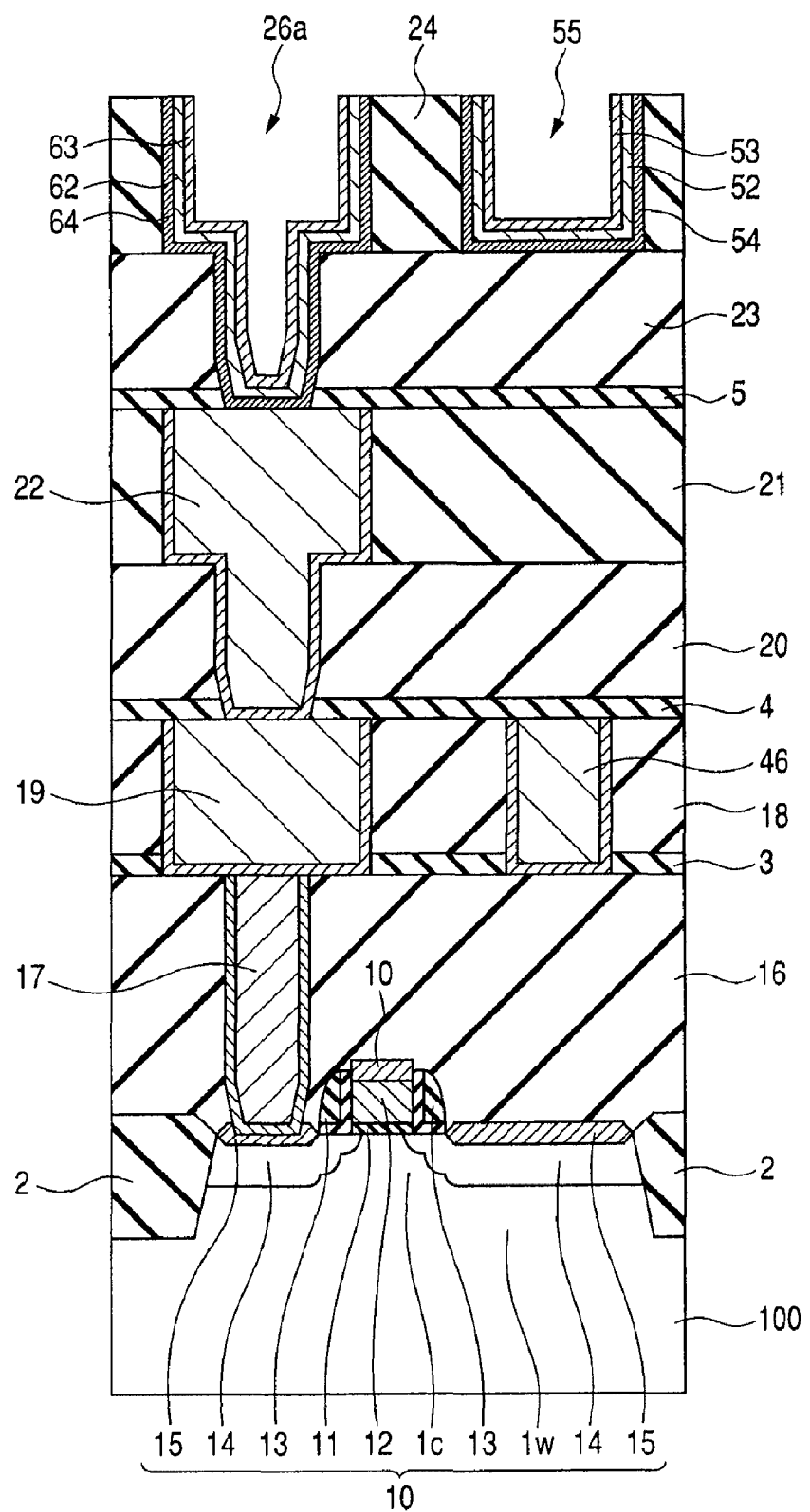
FIG. 15 is a cross-sectional view showing a manufacturing step after the manufacturing step shown in FIG. 14.

As shown in FIG. 15, the insulating film 5, and the insulating layers 23 and 24 are formed over the upper surface of the insulating layer 21 in that order. Thereafter, a contact hole 26a is formed in the insulating film 5 and the insulating layers 23 and 24, while a groove 55 for the digit line is formed in the insulating layer 24.

The barrier metal film 64 is formed in the contact hole 26a, and the barrier metal film 54 is formed over the inner surface of the groove 55 for the digit line. These barrier metal films are preferably formed of the same kind of material as that of each of the barrier metal films 41a, 41f, and 48 described above.

Figure 16:
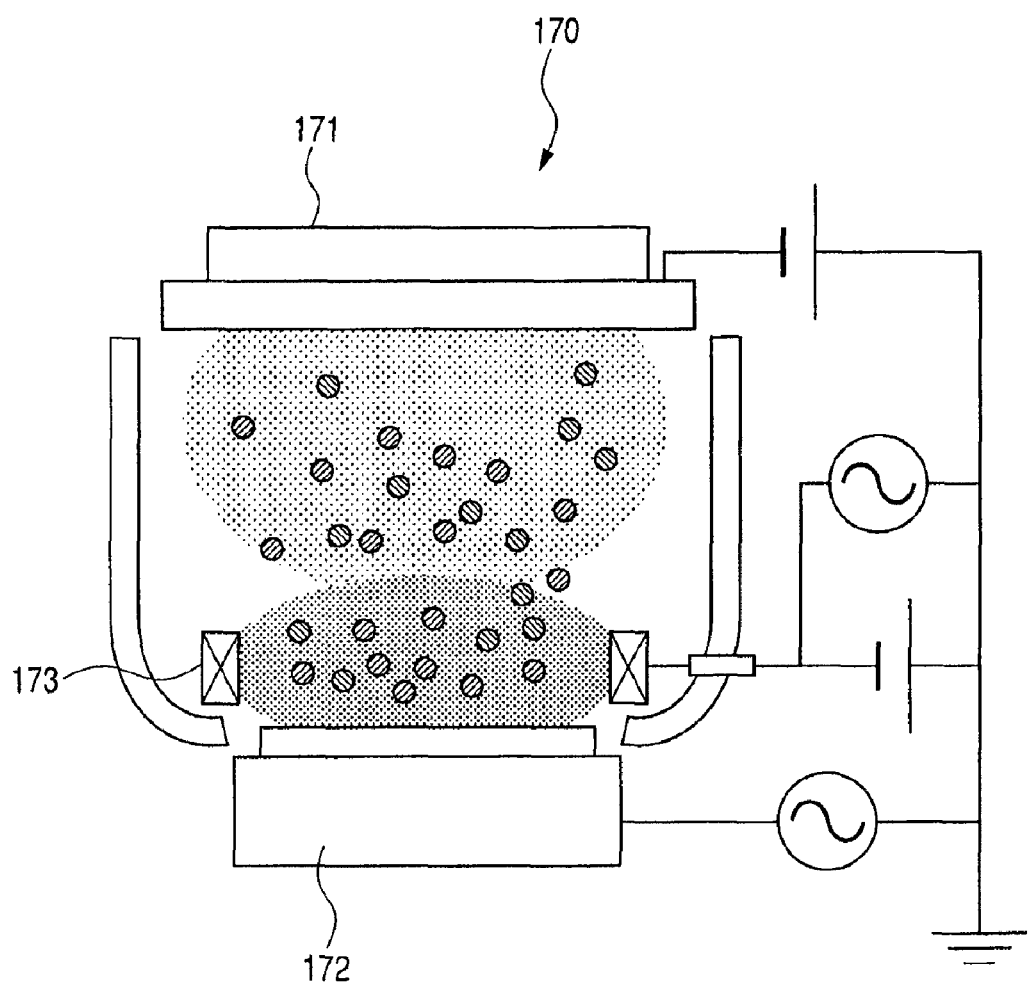
FIG. 16 is a schematic diagram of a sputtering device.

The barrier metal films 54 and 64 are deposited using a sputtering device 170 shown in FIG. 16. The sputtering device 170 is disposed in a chamber, and includes a stage 172 over which the semiconductor substrate is disposed during the manufacturing process, a target portion 171 where a target is disposed, a DC coil 173, and a high-frequency coil 174.

The directivity of particles in the chamber can be adjusted or controlled by a magnetic force generated from the DC coil 173 and the high-frequency coil 174.

When forming the barrier metal films 54a and 64, an AC power of about 200 W to 230 W is applied to the stage 172. A side coverage ratio of the barrier metal films 54 and 64 can be enhanced.

The term "side coverage ratio" means a ratio of the deposition rate of a film deposited on inner side surfaces of the contact hole 26a and the groove 55 for the digit line with respect to the deposition rate of a film deposited over the upper surface of the insulating layer 24 shown in FIG. 15 as a reference.

After forming the barrier metal films 54 and 64, the cladding layer 52 and the cladding layer 62 are formed as shown in FIG. 15. Such cladding layers are preferably comprised of the same kind of material as that of the above cladding layer 41d.

When forming the cladding layers 52 and 62, for example, a power of about 2000 W is applied to the high-frequency coil 174. For example, a power of about 0 to 500 W is applied to the DC coil 173. Further, the pressure in the chamber is set to about 0.2 Pa. A predetermined voltage is applied to each of the target 171 and the stage 172.

When the cladding layer is formed under the above conditions, the deposition rate of the cladding layer deposited over the inner side of the barrier metal film 54 is higher than that of the cladding layer deposited over the bottom of the barrier metal 54.

That is, the side coverage ratio in formation of the cladding layer is higher than that in formation of the barrier metal film 54.

The side coverage ratio in formation of the cladding layer is a ratio of the deposition rate of the cladding layer formed on the inner side of the barrier metal film 54 or 64 with respect to the deposition rate of the cladding layer formed on the upper surface of the insulating layer 24 as a reference. Thus, the thickness of the side wall of the formed cladding layer 52 is larger than that of the bottom wall of the formed cladding layer 52.

After forming the cladding layers in this way, the barrier metal films 53 and 63 are formed over the upper surfaces of the cladding layers. The deposition conditions for the barrier metal films 53 and 63 are the same as those for forming the barrier metal films 54 and 64.

Figure 17:
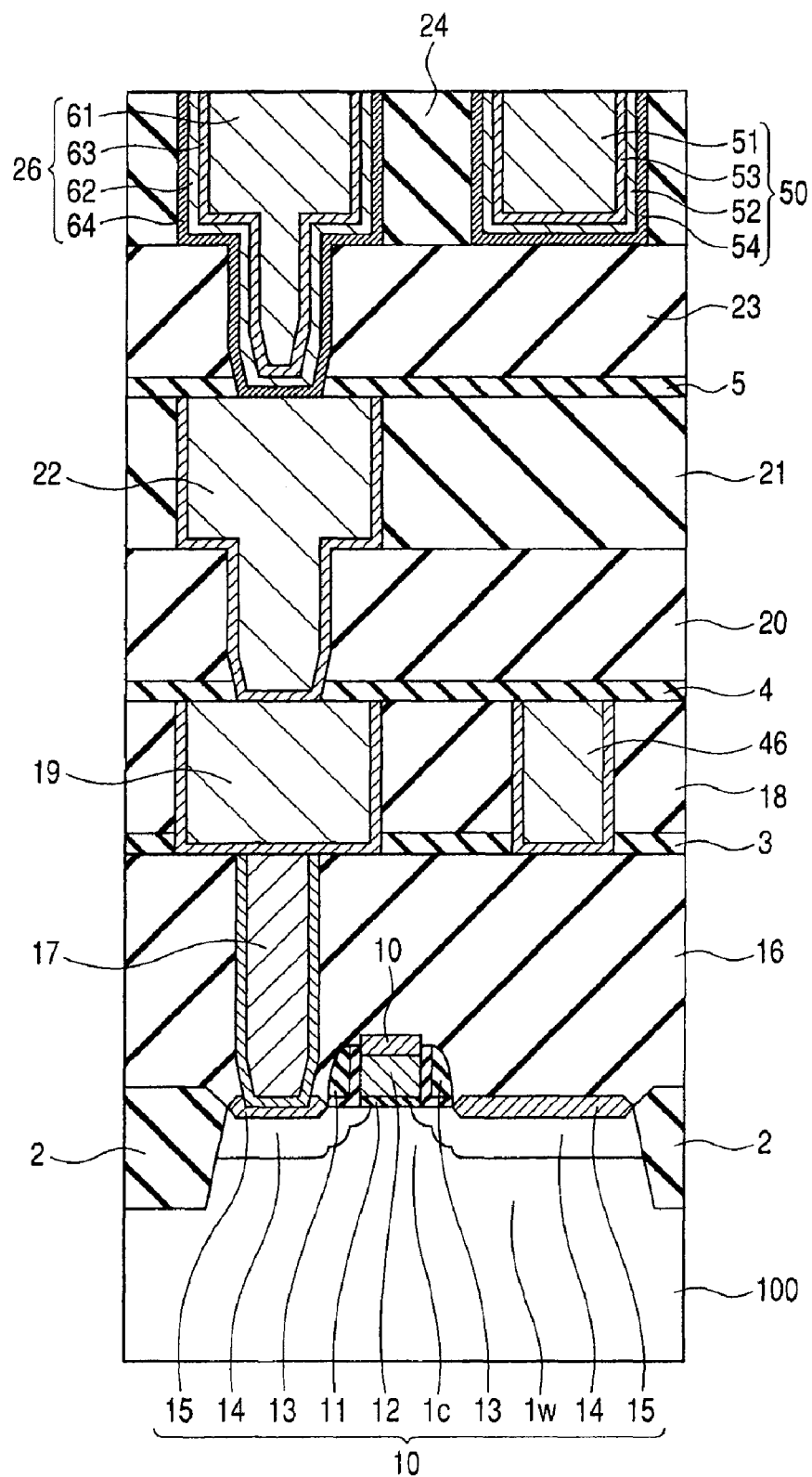
FIG. 17 is a cross-sectional view showing a manufacturing step after the manufacturing step shown in FIG. 15.

After forming the barrier metal films 53 and 63, a conductive film made of copper or the like is charged over the barrier metal films 53 and 63. After charging the conductive film, as shown in FIG. 17, the insulating layer 24 has its upper surface planarized by the CMP method to thereby form the unit contact 26 and the digit line 50. At the same time when the digit line 50 is formed, the unit contact 26 can be formed.

In this way, the insulating layer 16, the insulating film 3, the insulating layer 18, the insulating film 4, the insulating layer 20, the insulating layer 21, the insulating film 5, the insulating layer 23, and the insulating layer 24 are laminated in that order to form the interlayer insulating film 9.

Further, the unit contacts 17, 19, 22, and 26 are formed in that order to form the connection wiring 8.

Figure 18:
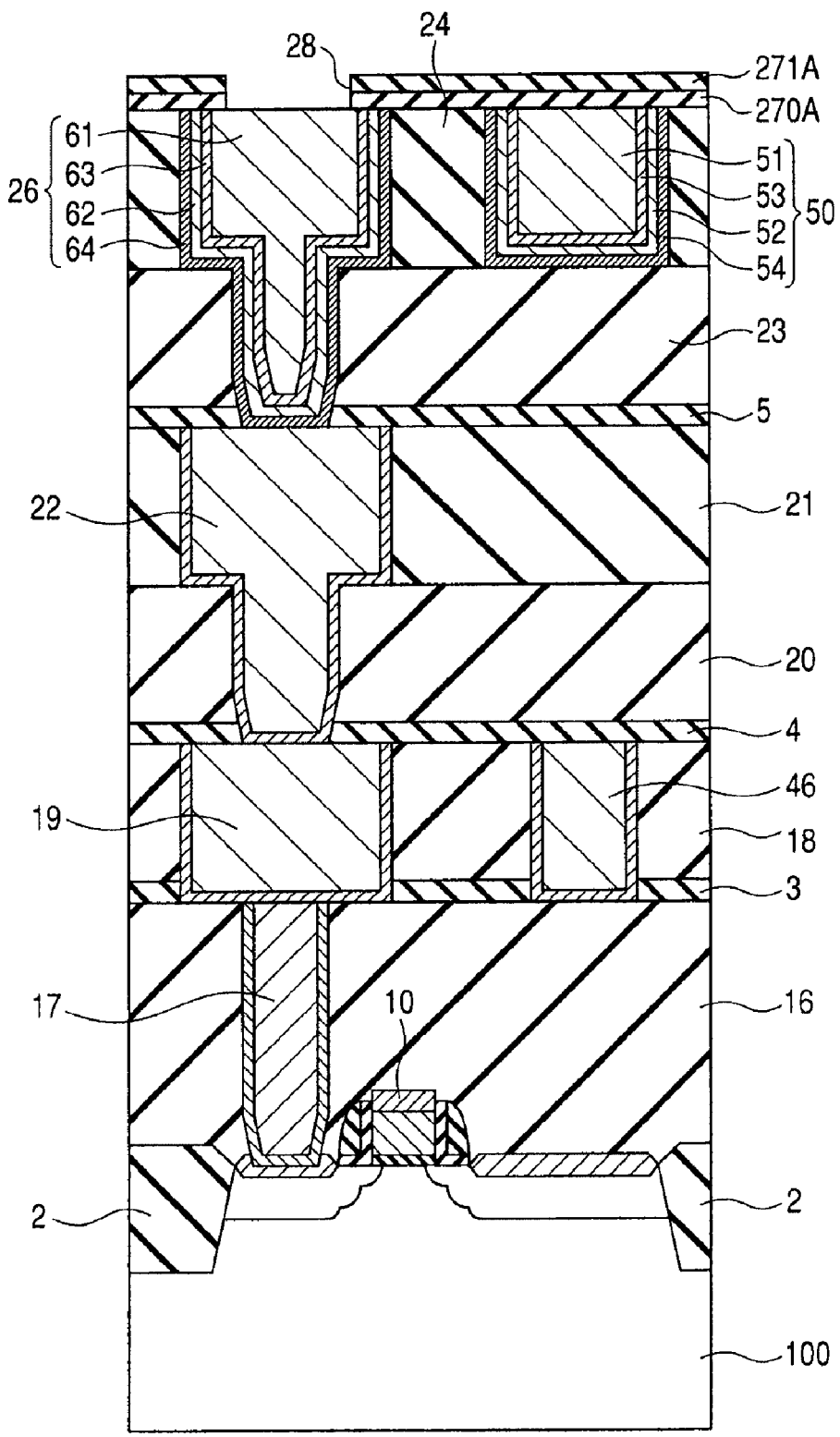
FIG. 18 is a cross-sectional view showing a manufacturing step after the manufacturing step shown in FIG. 17.

Then, as shown in FIG. 18, an insulating film 270A comprised of a silicon nitride (SiN) film or the like is formed over the upper surface of the insulating layer 24. An insulating film 271A comprised of a silicon oxide ($SiO_2$) film or the like is formed over the upper surface of the insulating film 270A. A through hole 28 is formed in these insulating films.

Figure 19:
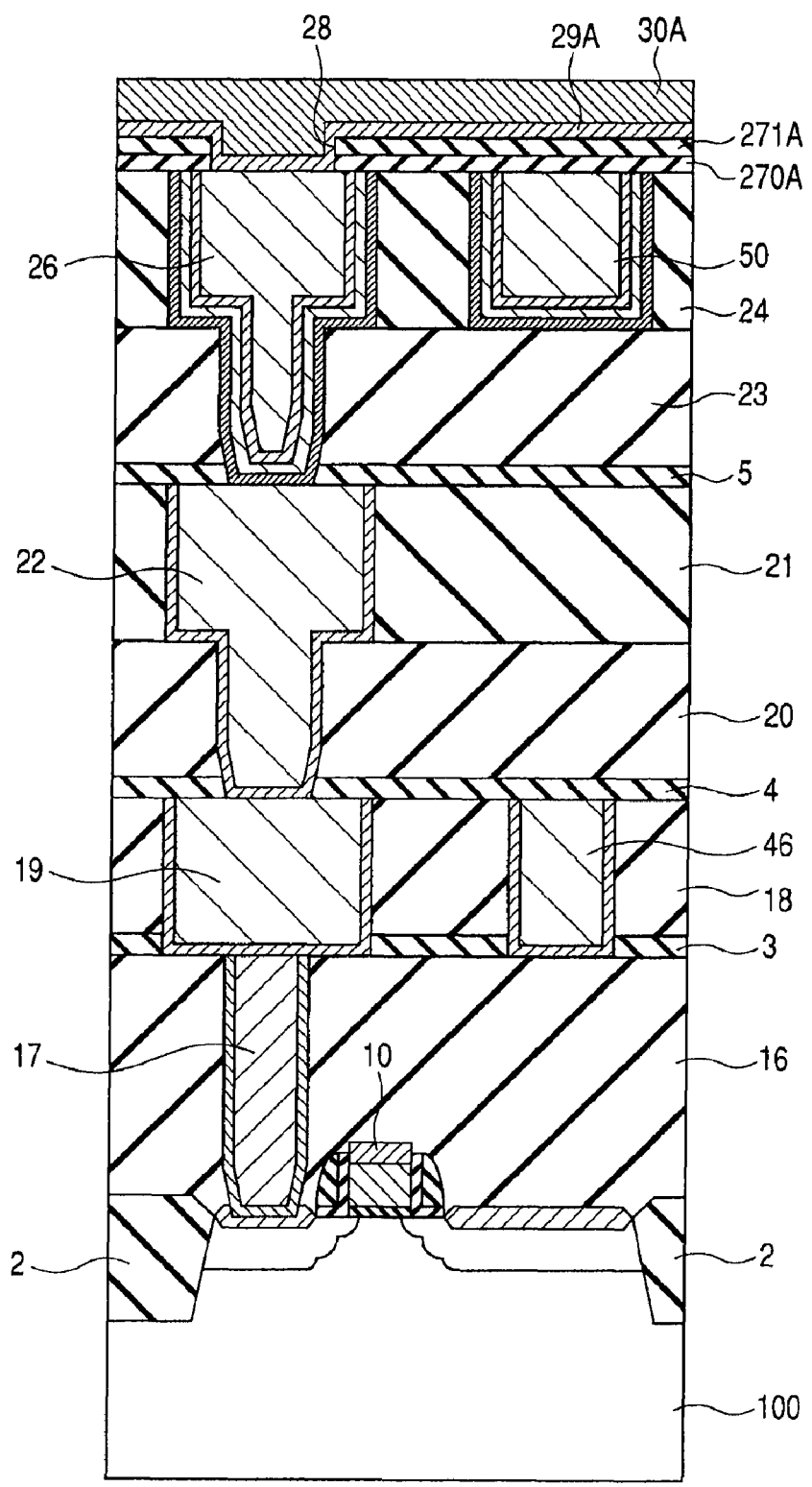
FIG. 19 is a cross-sectional view showing a manufacturing step after the manufacturing step shown in FIG. 18.

Then, as shown in FIG. 19, a barrier metal film 29A is formed over the insulating films 270A and 271A and the inner circumferential surface of the through hole 28. A conductive film 30A is deposited over the barrier metal film 29A.

Figure 20:
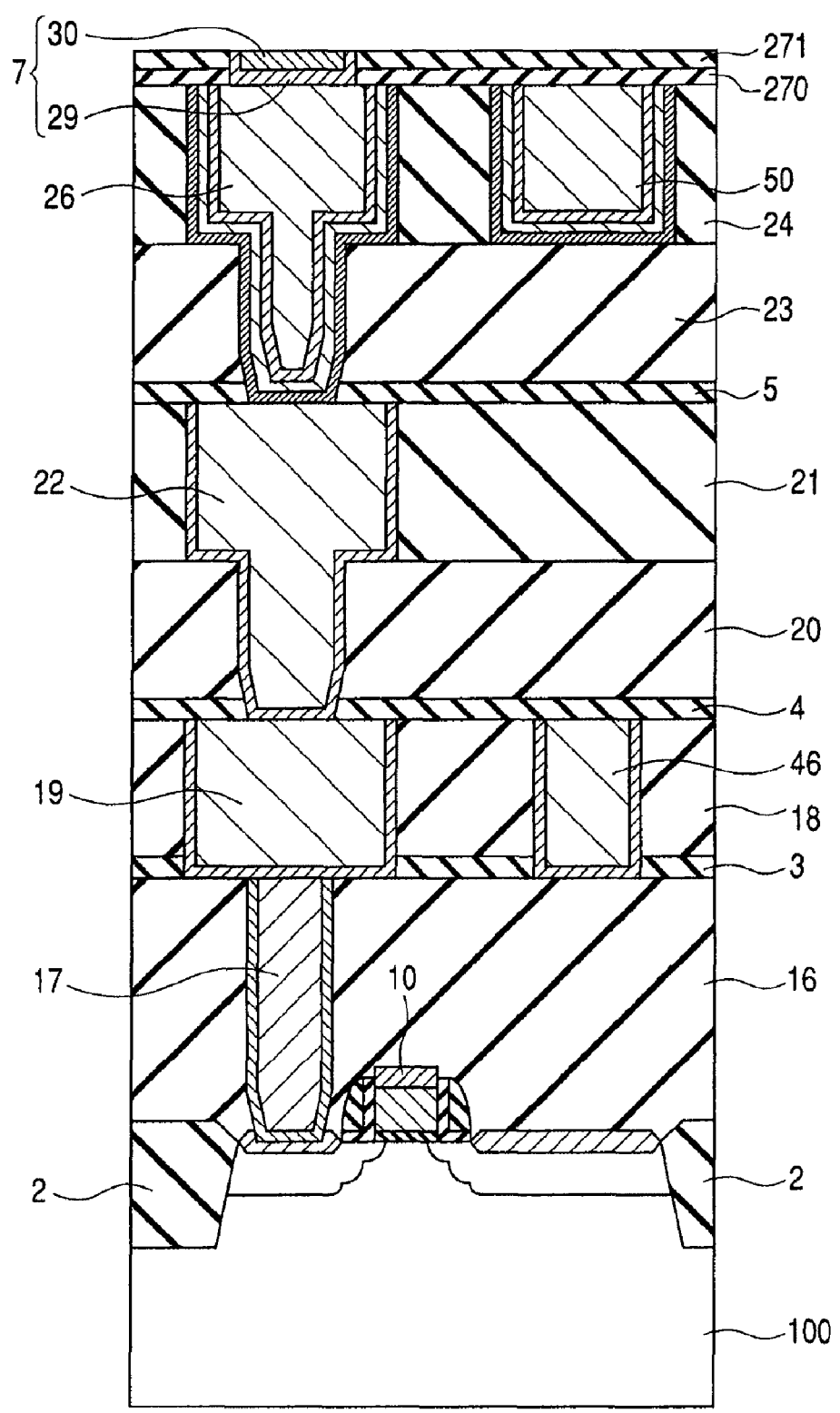
FIG. 20 is a cross-sectional view showing a manufacturing step after the manufacturing step shown in FIG. 19.

Thereafter, as shown in FIG. 20, the barrier metal film 29A and the conductive film 30A formed over the insulating film 271A are removed by the CMP method using the insulating film 270A as a stopper film.

Thus, the connection portion 7 comprised of the barrier metal film 29 and the conductive film 30 is formed. On the other hand, the upper surfaces of the insulating films 270A and 271A are planarized to form the flat insulating films 270 and 271.

Figure 7:
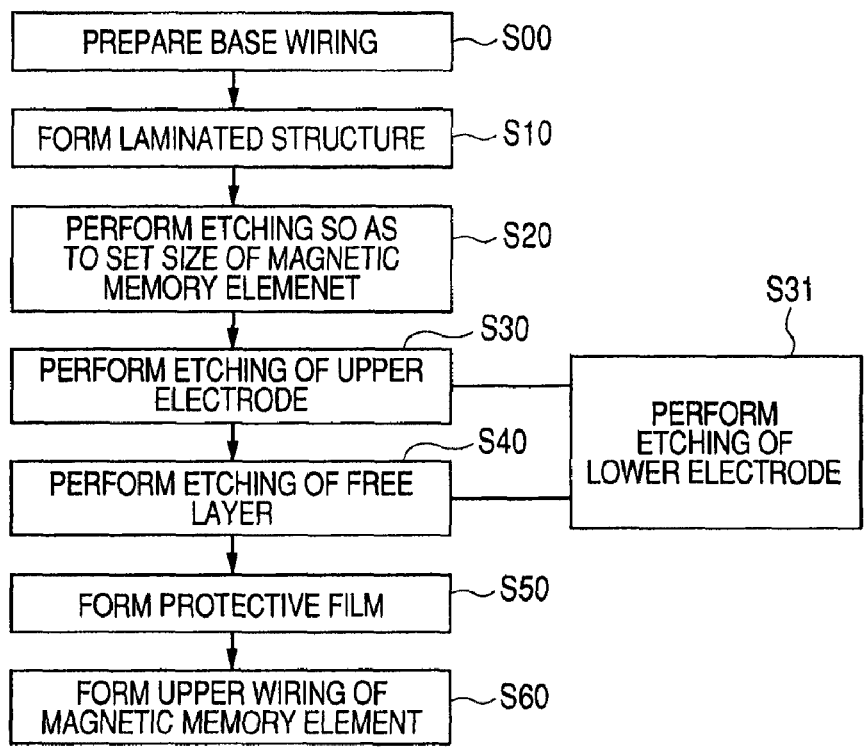
FIG. 7 is a flowchart showing a manufacturing method of the semiconductor device according to the first embodiment.

Next, the step (S10) of forming a laminated structure shown in the flowchart of FIG. 7 is performed. Specifically, this step involves forming the laminated structure comprised of the respective layers forming the magnetoresistive element, and the thin films forming the upper and lower electrodes of the magnetoresistive element using sputtering or the like.

Figure 21:
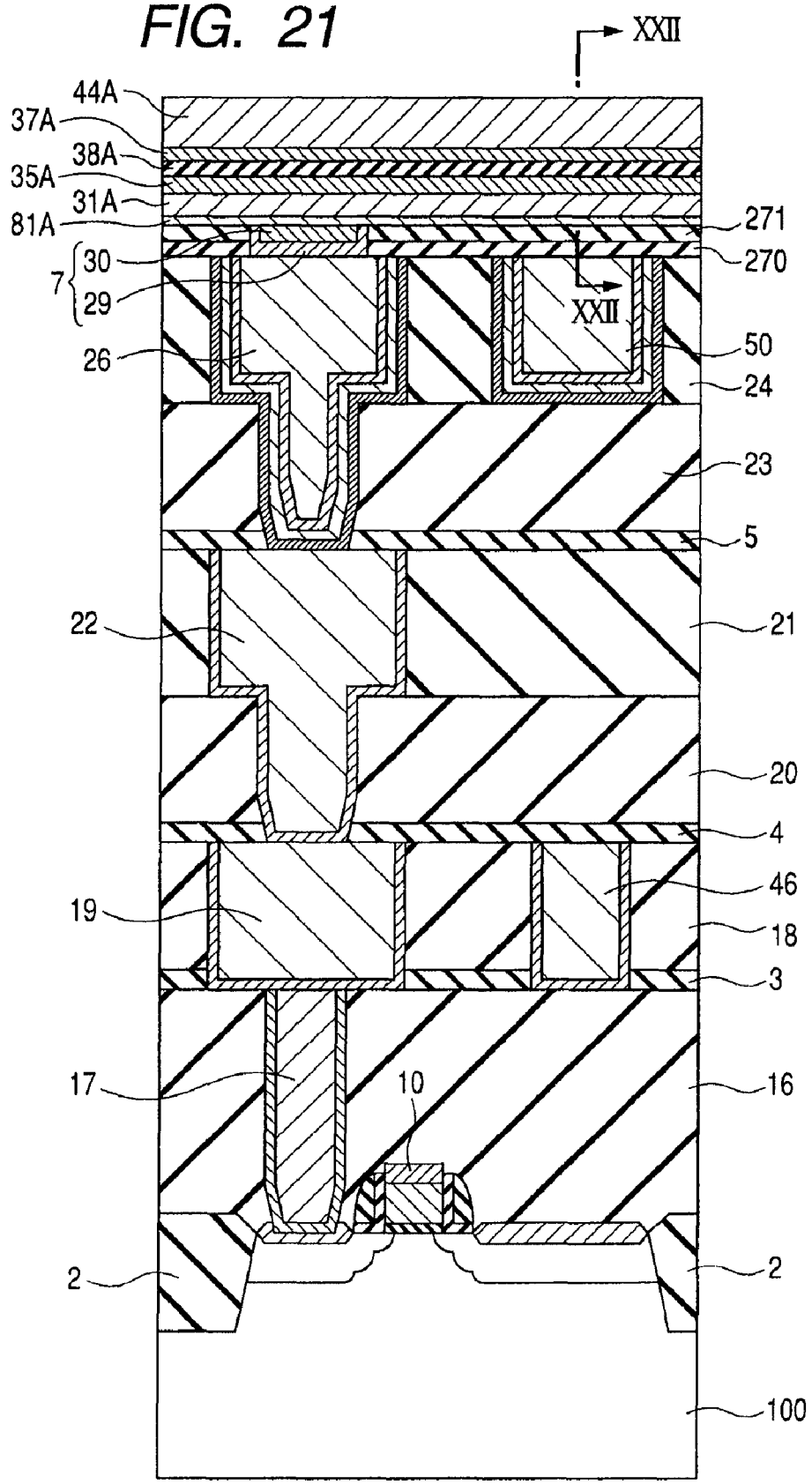
FIG. 21 is a cross-sectional view showing a manufacturing step after the manufacturing step shown in FIG. 20.

As shown in FIG. 21, first, a conductive film 81A and a conductive film 31A are formed. The conductive film 81A and the conductive film 31A are a layer (first conductive film) serving as the lower electrode (as the second lower electrode 81 and the first lower electrode 31, respectively). Thus, the conductive film 81A is preferably formed by depositing a thin film made of the material forming the above first lower electrode 31 in the above corresponding thickness. The conductive film 81A and the conductive film 31A are preferably comprised of materials having high etching selectivity to each other. In particular, preferably, the conductive film 31A is formed using material with a high selectivity to the magnetic layer, while the conductive film 81A is formed using material with a low selectivity to the magnetic layer.

Then, a conductive film 35A is formed over the conductive film 31A. This is a layer (first magnetic film) to serve as the above magnetization fixed layer 35. Thus, the conductive film 35A is preferably a laminated structure formed by depositing thin films including the above seed layer 35p, the antiferromagnetic layer 35q, the ferromagnetic layer 35r, the nonmagnetic layer 35s, and the ferromagnetic layer 35t from the lower side (conductive film 31A side) in the above respective thicknesses.

An insulating film 38A is formed over the conductive film 35A. This is a layer (insulating film) to serve as the above tunneling insulating film 38. Thus, the insulting film 38A is preferably formed by depositing a thin film made of the material for forming the above tunneling insulating film 38 in the above thickness.

The conductive film 37A is formed over the insulating film 38A. This is a layer (second magnetic film) to serve as the above magnetization free layer 37. Thus, the conductive film 37A is preferably formed by depositing a thin film made of the material for forming the above magnetization free layer 37 in the above thickness. The material forming the conductive film 37A and the material for the conductive film 81A are preferably comprised of materials having low etching selectivity (a small difference in etching rate). Thus, the material forming the conductive film 37A and the material for the conductive film 31A are preferably comprised of materials having high etching selectivity.

A conductive film 44A is formed over the conductive film 37A. This is a layer (second conductive film) to serve as the first upper electrode 44. Thus, the conductive film 44A is preferably formed by depositing a thin film comprised of the same material as that of the conductive film 31A in the above thickness of the first upper electrode 44.

Figure 22:
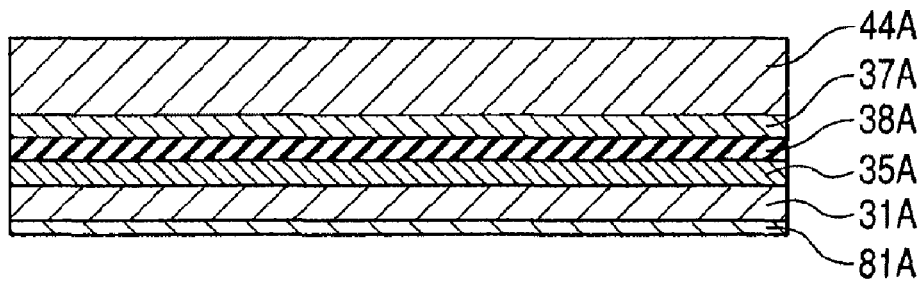
FIG. 22 is an enlarged cross-sectional view of an upper portion shown in FIG. 21, taken along the line XXII-XXII.

The laminated structure shown in FIG. 22 is formed by the above steps. FIGS. 22 to 42 show the form of the laminated structure only on the upper side of the conductive film 81A shown in FIG. 21 as viewed in the same direction as in FIG. 4, and omit the illustration of the left side of the structure from the insulating film 271A shown in FIG. 21.

Figure 23:
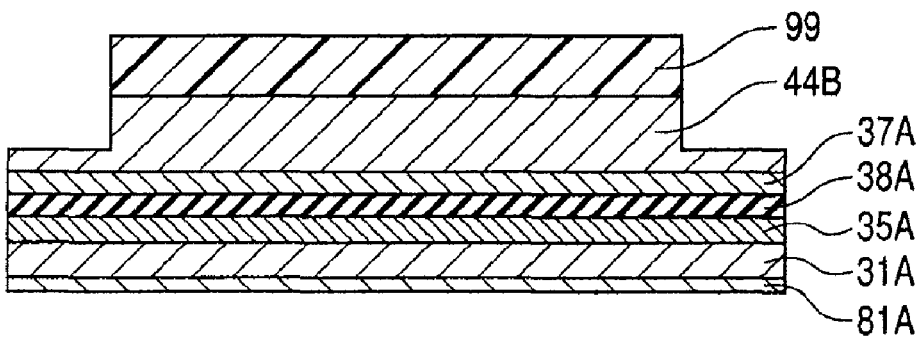
FIG. 23 is a cross-sectional view showing a manufacturing step after the manufacturing step shown in FIG. 22.

Then, an etching process is performed so as to set the size of the magnetoresistive element as shown in the flowchart of FIG. 7 (in step S20). As shown in FIG. 23, first, a resist 99 is applied over the conductive film 44A, and subjected to the photolithography, whereby the conductive film 44A is etched into the size of a planar shape (the size as viewed in a planar manner) of the lower electrode to be finally formed. For example, a reactive ion etching (RIE) is preferably used as the etching in this case. The etching of the lower electrode provides electrical isolation between the respective magnetoresistive elements to be finally formed. As a result, the conductive film 44A becomes a conductive film 44C shown in FIG. 24 through the conductive film 44B.

As shown in FIG. 23, the time required for etching is estimated, for example, from the thickness of the conductive film 44B. When the etching proceeds up to the lowermost end of the conductive film 44B to form the conductive film 44C, the etching is finished. Alternatively, over-etching may be performed when the conductive film 44C is obtained. At this time, the etching gases preferably include a mixed gas of $CF_4$ (methane tetrafluoride) and Ar(argon).

Figure 24:
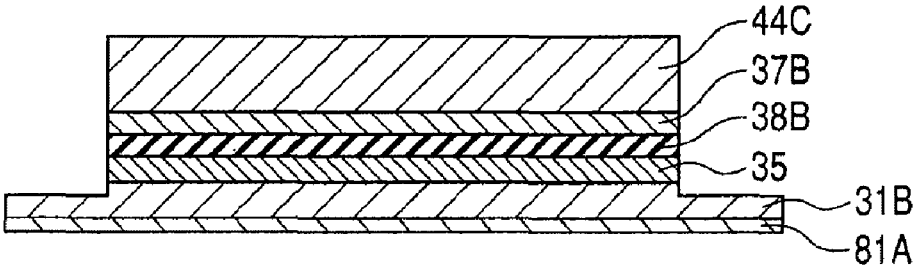
FIG. 24 is a cross-sectional view showing a manufacturing step after the manufacturing step shown in FIG. 23.

After forming the conductive film 44C, the resist 99 is removed using $NH_3$(ammonia) gas, and then another etching process is further continued by switching the etching gas into a mixed gas of CO (carbon monoxide) and $NH_3$ gas as an etching gas. At this time, parts (upper sides) of the conductive film 37A, the insulating film 38A, the conductive film 35A, and the conductive film 38B under the conductive film 44C are etched to form the conductive film 37B, the insulating film 38B, the magnetization fixed layer 35 and the conductive film 31B as shown in FIG. 24, respectively.

In a case where the layer of the conductive film 35A to serve as the seed layer 35p is made of Ta or TaN, or in a case where the conductive film 31A is made of Ta or TaN, the etching gas is preferably switched again to a mixed gas of $CF_4$ and Ar when the region of the layer as the seed layer 35p or the film 31A is etched.

Figure 25:
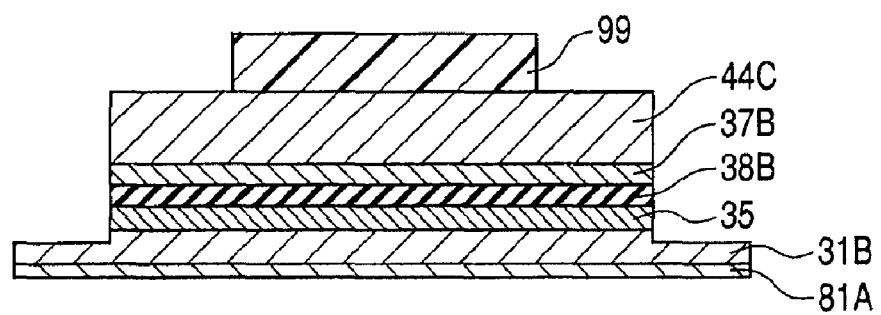
FIG. 25 is a cross-sectional view showing a manufacturing step after the manufacturing step shown in FIG. 24.

Then, as shown in FIG. 25, the resist 99 is applied to the conductive film 44C and subjected to the photolithography, whereby the conductive film 44C is etched into the size of a planar shape of the first upper electrode 44 to be finally formed. The size of the planar shape of the first upper electrode 44 finally formed is smaller than that of a planar shape of the magnetization fixed layer 35. The etching gas at this time is preferably a mixed gas of CF4 and Ar.

Figure 26:
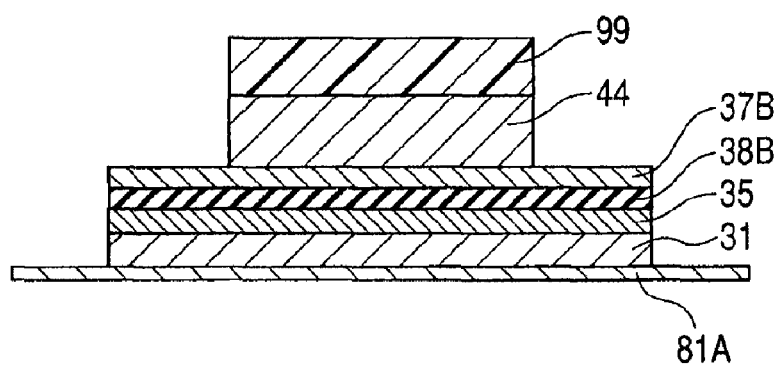
FIG. 26 is a cross-sectional view showing a manufacturing step after the manufacturing step shown in FIG. 25.

At this time, as shown in FIG. 26, the conductive film 44C and the conductive film 31B are simultaneously etched to thereby form the first lower electrode 31 having the same size of the magnetization fixed layer 35. This is because the conductive film 44C and the conductive film 31B are comprised of the same material.

The term "same size" means the shape including the substantially same planar pattern formed based on the same resist mask, and further including the sides with continuous ends. The same goes for the description of the present specification below.

Specifically, for example, the planar pattern formed based on the same resist mask is often shaped such that one side of the pattern (for example, the lower side of the laminated structure) opposite to the other side with the resist mask formed is a slightly larger in area than the other side with the resist mask formed (for example, the upper side of the laminated structure). In this case, the areas of the upper and lower sides of the planar pattern can be regarded as the same.

The phrase "the conductive film 44C and the conductive film 31B made of the same material" as used in the above description may mean the conductive film 44c and the conductive film 31B contains the same principle component so as to exhibit the low etching selectivity of both materials for these films to each other. That is, even if a few different impurities are contained in the conductive film 44C and the conductive film 31B, the principle components contained in these films may be the same. The same goes for the description of the present specification below.

The etching of the conductive film 31B almost stops until it reaches the lower end of the film 31B, and thus the conductive film 81A under the film 31B is hardly etched. This is because the conductive film 31B and the conductive film 81A are comprised of the materials having high etching selectivity to each other. Thus, it can be less necessary to accurately control the thicknesses of the conductive films 44C and 31A, and to estimate the time required for etching. Thus, the manufacturing process can be simplified. The process for forming the first upper electrode 44 by etching the conductive film 44C and the process for forming the first lower electrode 31 by etching the conductive film 31B as shown in FIG. 26 are simultaneously performed in steps, which are represented by the step (S30) of forming the upper electrode by etching and the step (S31) of forming the lower electrode by etching in the flowchart of FIG. 7.

The term "upper electrode" in the step(S30) for forming the upper electrode by etching means a layer (second conductive film) to serve as the upper electrode. The term "lower electrode" in the step(S31) for forming the lower electrode by etching means a layer (first conductive film) to serve as the lower electrode.

Figure 27:
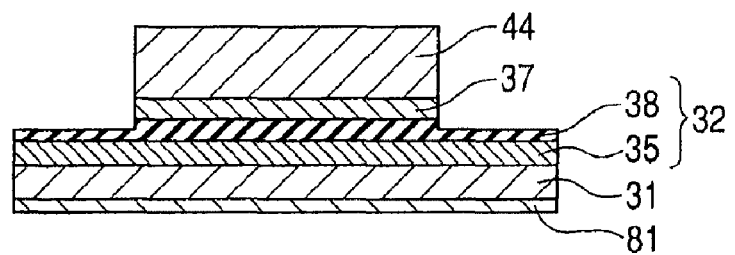
FIG. 27 is a cross-sectional view showing a manufacturing step after the manufacturing step shown in FIG. 26.

Then, as shown in FIG. 27, after removing the resist 99 by $NH_3$ gas, the conductive film 37B is etched. The etching gas at this time is preferably a mixed gas of CO and $NH_3$ gas. At this time, the conductive film 37B and the conductive film 81A are simultaneously etched to thereby form the magnetization free layer 37 having the same size as that of the first upper electrode 44, and the second lower electrode 81 having the same size as that of the first lower electrode 31. As shown in FIG. 27, at this time, a part (upper side) of the insulating film 38B may be simultaneously etched to form the tunneling insulating film 38 with a stepped portion. This is because the conductive film 37B and the conductive film 81A are comprised of materials having low etching selectivity to each other. The process for forming the magnetization free layer 37 by etching the conductive film 37B and the process for forming the second lower electrode 81 by etching the conductive film 81A as shown in FIG. 27 are simultaneously performed in steps, which are represented by the step (S40) of etching the free layer and the step (S31) of forming the lower electrode by etching in the flowchart of FIG. 7.

The term "free layer" in the step(S40) for forming the free layer by etching means a layer (second conductive film) to serve as the free layer.

As mentioned above, after slightly etching the lower conductive film first, the lower conductive film is simultaneously etched at the same time as the etching of the upper conductive film. The use of this method can avoid the problem of excessive etching of the lower insulating film of the lower electrode, which may possibly occur when forming the upper electrode after forming the lower electrode in advance. This is because the manufacturing method is to cause the lower conductive film to protect the interlayer insulating film 9 under the lower conductive film when etching the upper conductive film. This can suppress the damage to the connection wiring 8 by etching the interlayer insulating film 9 under the lower electrode.

Figure 28:
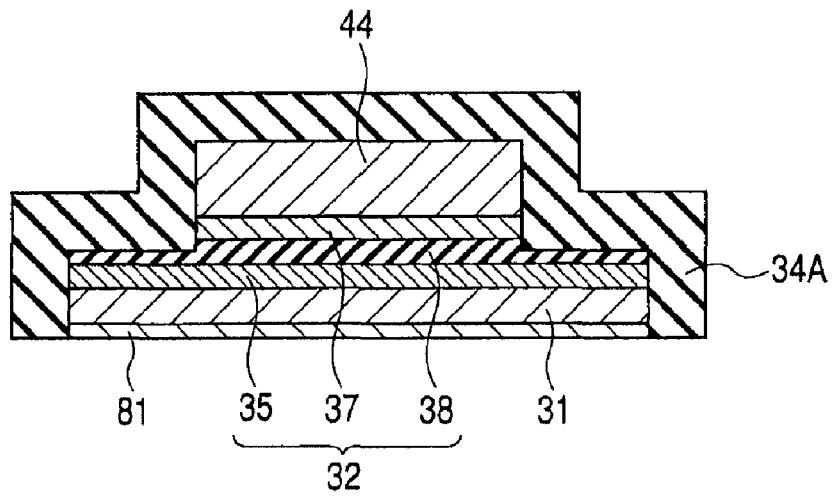
FIG. 28 is a cross-sectional view of a manufacturing step after the manufacturing step shown in FIG. 27, showing the form of the magnetoresistive element, upper electrode, and lower electrode according to the first embodiment.

Then, the process for forming the protective film (step S50) is performed as shown in the flowchart of FIG. 7. Specifically, as shown in FIG. 28, this step involves forming a protective film 34A so as to cover the sides and upper surface of a structure comprised of the upper electrode, the magnetoresistive element 32, and the lower electrode formed in the step of FIG. 27. The protective film 34A is comprised of material suppressing oxidation of the magnetization fixed layer 35 or magnetization free layer 37, such as SiN. The protective film 34A is preferably formed using a chemical vapor deposition (CVD) or the like. The protective film 34A preferably has a thickness of not less than 10 nm nor more than 80 nm, and more preferably not less than 40 nm nor more than 70 nm.

In this way, the formation of the protective film 34A after etching for forming the magnetoresistive element 32 can reduce the possibility of damage on the protective film 34A due to the etching in the following process. As a result, the high-quality protective film 34A can be formed. The protective film 34A is formed to cover the sides of the entire magnetoresistive element 32 including both of the magnetization free layer 37 and the magnetization fixed layer 35. The use of the above manufacturing method can form the magnetoresistive element 32 that can further suppress the leakage of the magnetic field from the magnetization fixed layer 35 into the magnetization free layer 37 in use. This arrangement can provide the semiconductor device 200 which can suppress variations in operation between the magnetoresistive elements 32 more precisely.

Figure 29:
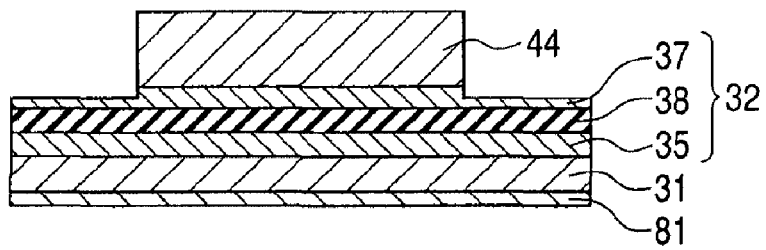
FIG. 29 is a cross-sectional view showing a first modified example of FIG. 27.
Figure 30:
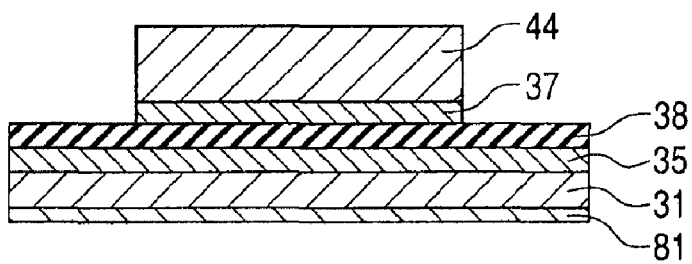
FIG. 30 is a cross-sectional view showing a second modified example of FIG. 27.
Figure 31:
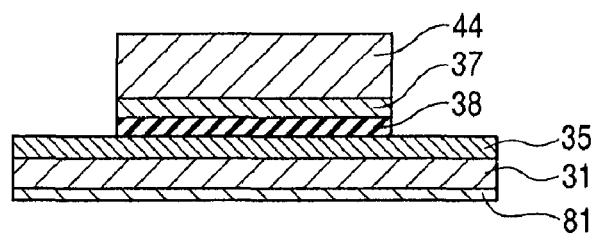
FIG. 31 is a cross-sectional view showing a third modified example of FIG. 27.

Referring to FIGS. 27 and 28, a part of the insulating film 38B is simultaneously etched together with the conductive film 37B in the process for etching the free layer (S40), and the tunneling insulating film 38 with the stepped shape is illustrated. As shown in FIG. 29, however, for example, only the part of the conductive film 37B may be etched in the process (S40), so that the magnetization free layer 37 with the stepped shape may be formed. Alternatively, as shown in FIG. 30, in the process (S40), only the entire conductive film 37B may be etched, whereby the structure with the magnetization free layer 37 and the tunneling insulating film 38 may be formed without etching the entire insulating film 38B. Alternatively, as shown in FIG. 31, the entire conductive film 37B and the insulating film 38B may be etched in the process(step S40), so that the structure with the tunneling insulating film 38 having the same size as that of the magnetization free layer 37 may be formed.

Subsequently, the process for forming an upper wiring of the magnetoresistive element (S60) is performed as shown in the flowchart of FIG. 7. Specifically, this step involves coupling the bit lines 40 shown in FIGS. 3 and 4 to the magnetoresistive element 32.

Figure 32:
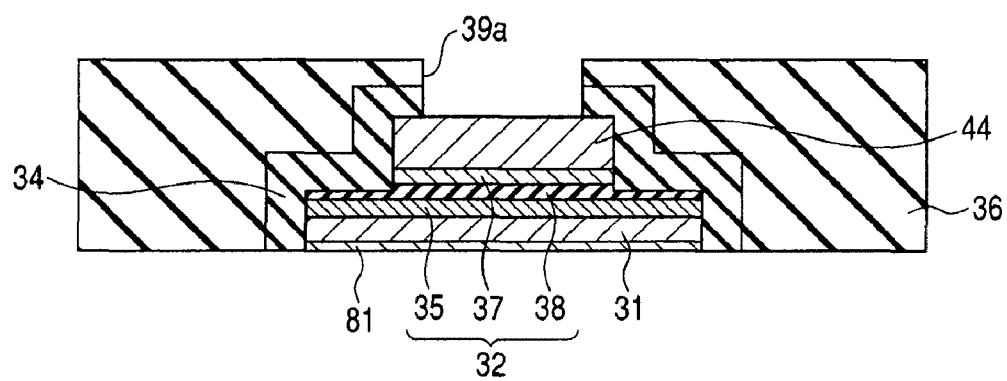
FIG. 32 is a cross-sectional view showing a manufacturing step after the manufacturing step shown in FIG. 28.

As shown in FIG. 32, first, an insulating layer made of a silicon oxide film or the like is formed to cover the protective film 34A of the magnetoresistive element 32 shown in FIG. 28 and the surroundings of each lower electrode. The insulating layer is subjected to the CMP process. A resist pattern for forming a contact hole 39a is formed over the insulating film. The resist pattern is used to form the contact hole 39a. In this way, the insulating layer 36 and the protective film 34 are formed in a desired shape.

Figure 33:
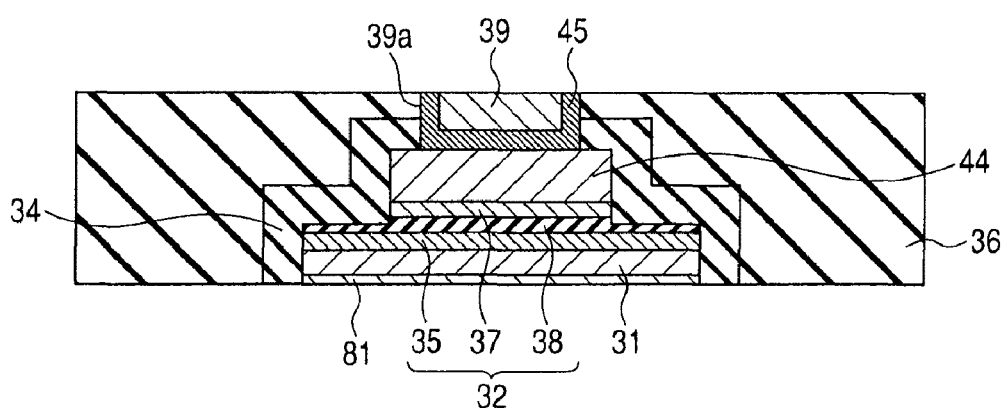
FIG. 33 is a cross-sectional view showing a manufacturing step after the manufacturing step shown in FIG. 32.

Then, a barrier metal film is formed over the uppermost surface of the insulating layer 36 and the inner surface of the contact hole 39a shown in FIG. 32, and the contact hole 39a with the barrier metal film formed thereover is filled with a conductive film. The conductive film and the barrier metal film are planarized by the CMP process. Thus, as shown in FIG. 33, the barrier metal film 45 charged in the contact hole 39a and the conductive film are formed to thereby form the contact portion 39. The conductive film may be comprised of copper which is the same as that of the wiring body 43, or W(tungsten). When the conductive film is comprised of copper, the barrier metal film 45 is preferably comprised of Ta or TaN. When the conductive film is comprised of tungsten, the barrier metal film 45 is preferably comprised of Ti(titanium) or TiN(titanium nitride).

Figure 34:
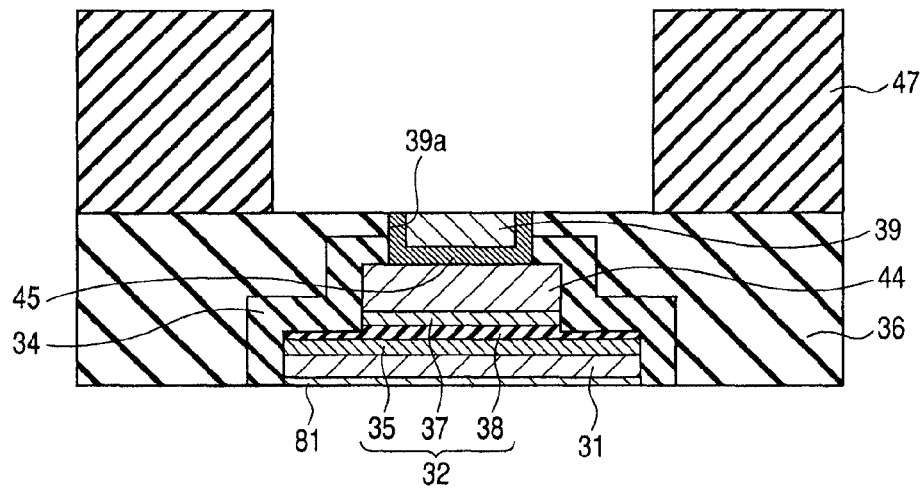
FIG. 34 is a cross-sectional view showing a manufacturing step after the manufacturing step shown in FIG. 33.

Then, a liner film made of a silicon nitride film or the like, and an insulating layer made of a silicon oxide film or the like are formed by the CVD method over the uppermost surface of the insulating layer 36 and the contact portion 39. FIG. 34 illustrates only the insulating layer made of the silicon oxide film, and omits illustration of the liner film. The photolithography, etching, and the like are performed so as to remove the region of the liner film and the insulating layer above the magnetoresistive element 32. In this way, as shown in FIG. 34, the insulating layer 47 formed in the groove located, especially above the magnetoresistive element 32 is formed. The groove extends across the adjacent magnetoresistive elements 32 in the direction perpendicular to the paper surface of FIG. 34.

Figure 35:
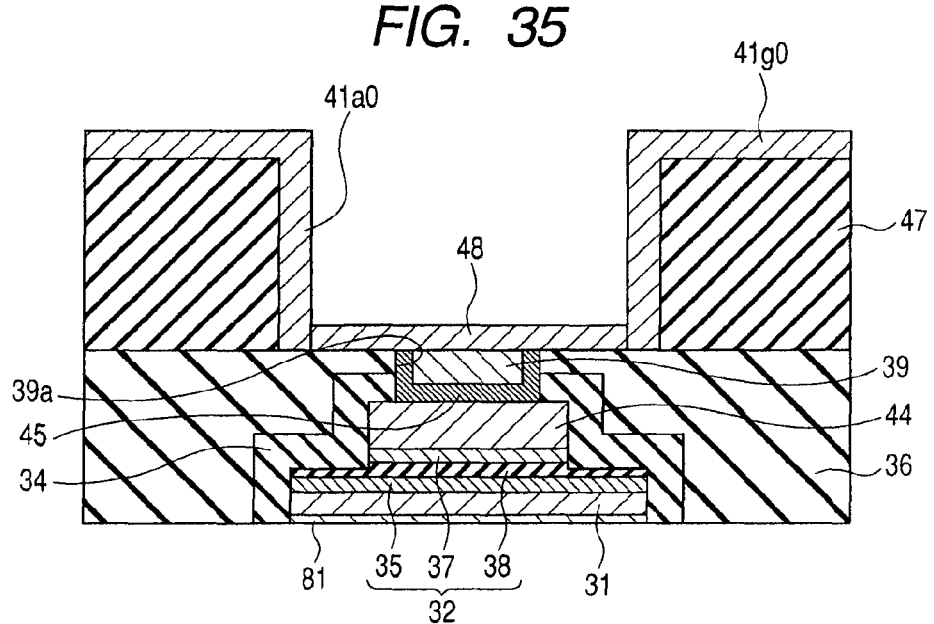
FIG. 35 is a cross-sectional view showing a manufacturing step after the manufacturing step shown in FIG. 34.

Then, a barrier metal film is formed over the uppermost surface of the insulating layer 47 and the inner surface of the groove by sputtering or the like as shown in FIG. 35. The barrier metal film is preferably comprised of Ta or TaN. The barrier metal film formed on the uppermost surface of the insulating film 47 is hereinafter referred to as a "barrier metal film 41g0", the barrier metal film formed on the inner side of the groove to as a "barrier metal film 41a0", and the barrier metal film formed on the internal bottom of the groove to as a "barrier metal film 48", respectively, which are simultaneously formed integrally with each other.

Figure 36:
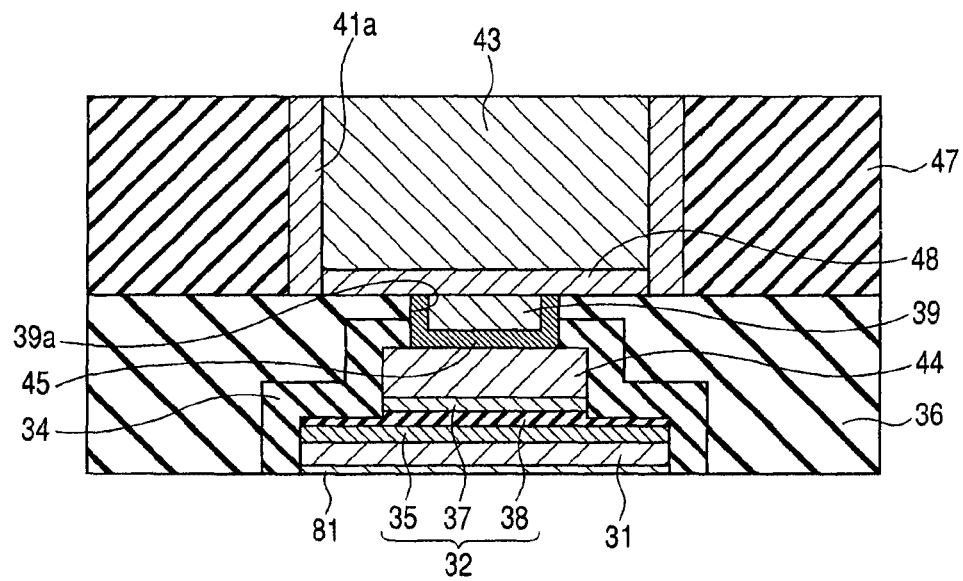
FIG. 36 is a cross-sectional view showing a manufacturing step after the manufacturing step shown in FIG. 35.
Figure 37:
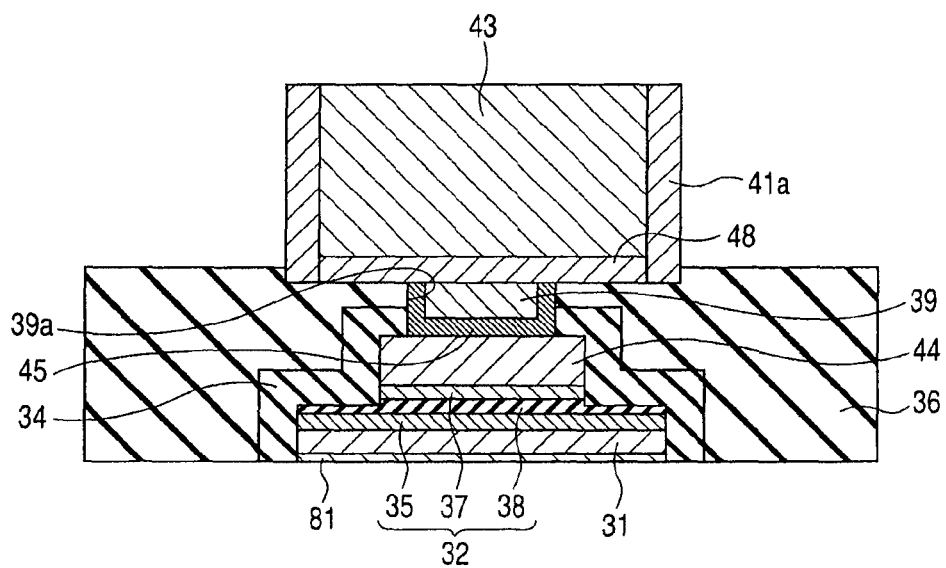
FIG. 37 is a cross-sectional view showing a manufacturing step after the manufacturing step shown in FIG. 36.

Thereafter, a conductive film made of, for example, copper is charged into the groove with the barrier metal film formed thereover, as shown in FIG. 36. The conductive film is planarized to form the wiring body 43. Then, the insulating layer 47 is removed by photolithography and etching and the like. In this way, as shown in FIG. 37, the barrier metal film 41g0 is removed from the barrier metal film 41a0 to provide the barrier metal film 41a on the sides of the wiring body 43. The barrier metal film 48 is positioned under the lower surface of the wiring body 43.

Figure 38:
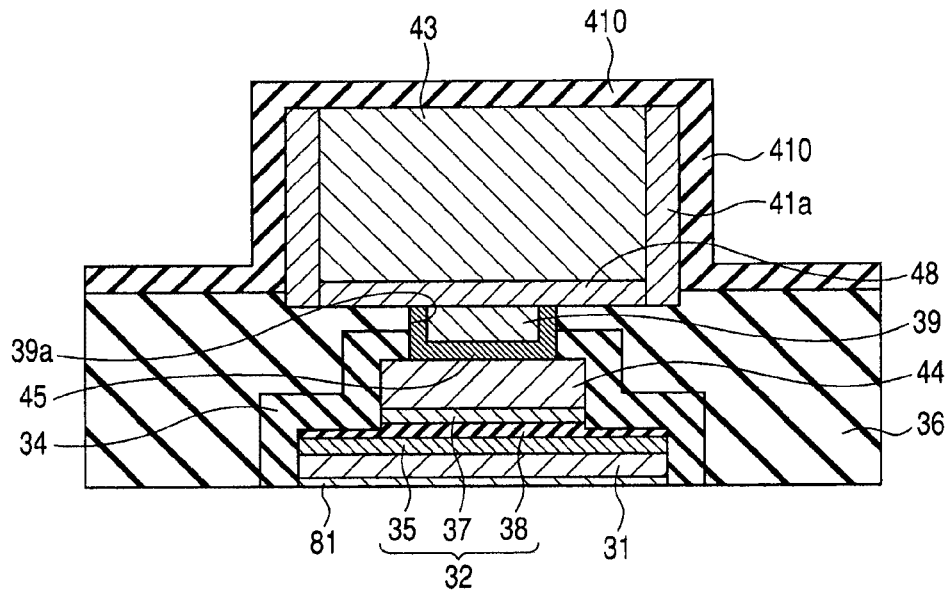
FIG. 38 is a cross-sectional view showing a manufacturing step after the manufacturing step shown in FIG. 37.

Subsequently, as shown in FIG. 38, the liner film 410 is formed to cover the sides and upper surface of the wiring body 43 including the barrier metal film, and further the upper surface of the insulating film 36. The liner film 410 is preferably formed using the chemical vapor deposition (CVD) method or the like.

Figure 39:
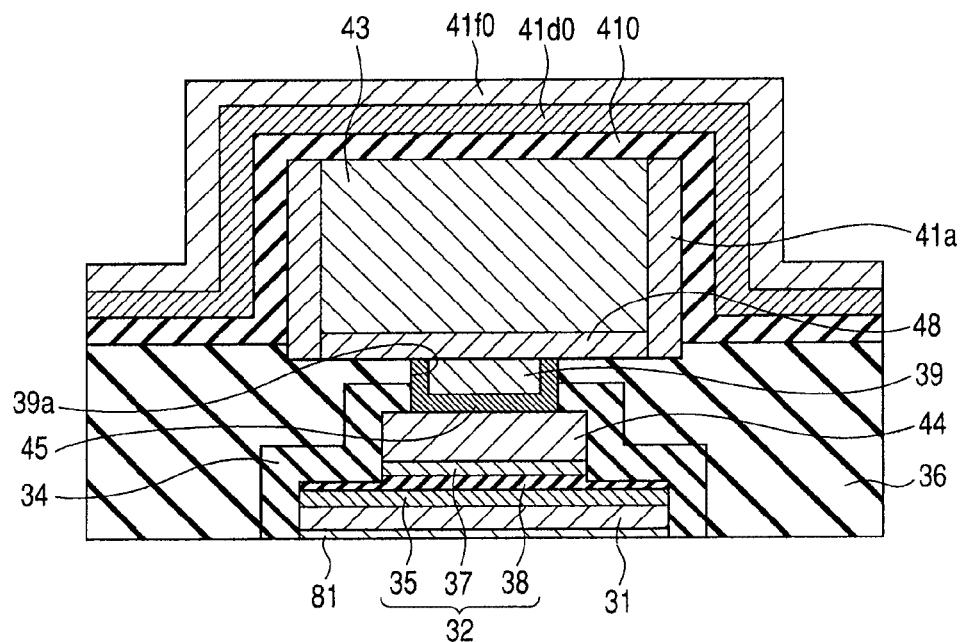
FIG. 39 is a cross-sectional view showing a manufacturing step after the manufacturing step shown in FIG. 38.
Figure 40:
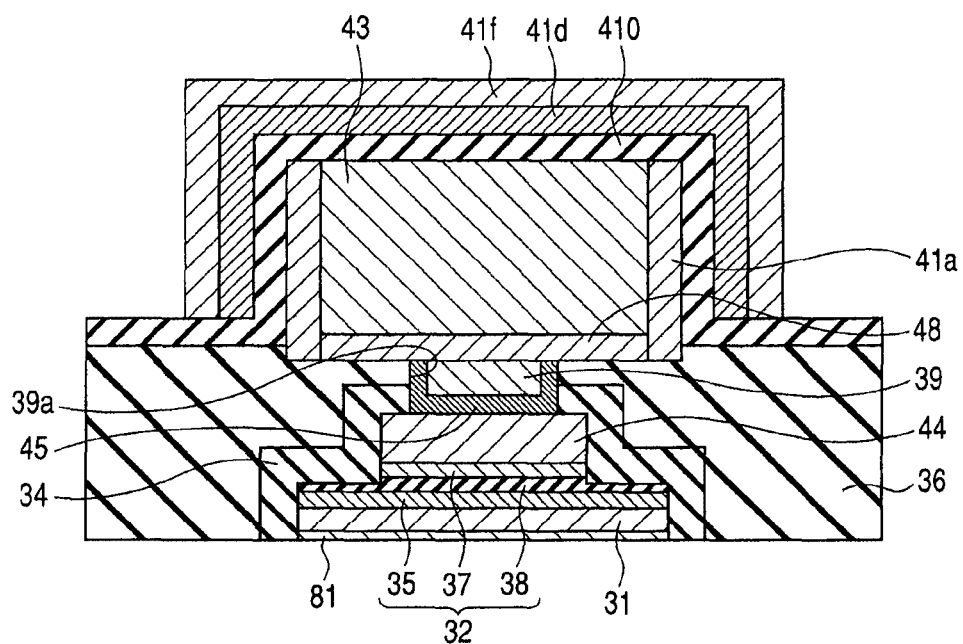
FIG. 40 is a cross-sectional view showing a manufacturing step after the manufacturing step shown in FIG. 39.

Further, as shown in FIG. 39, the cladding layer 41d0 and the barrier metal film 41f0 are formed to cover the upper surface of the liner film 410. Thereafter, parts of the cladding layer 41d0 and the barrier metal film 41f0 covering the upper surface of the insulating layer 36 and located over the liner film 410 are removed by etching to form the cladding layer 41d and the barrier metal film 41f shown in FIG. 40.

Figure 41:
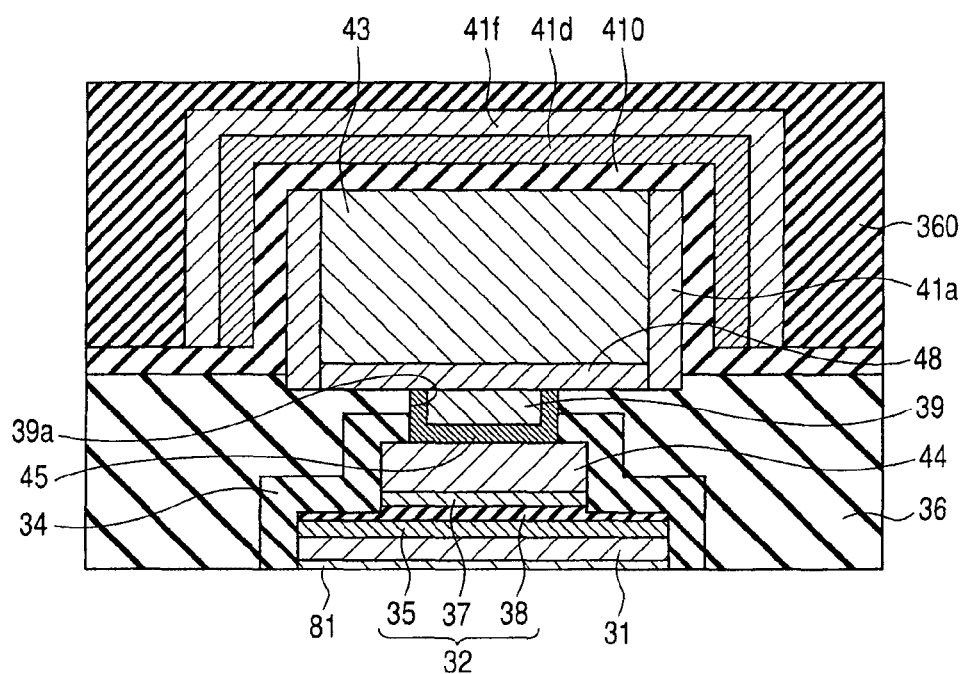
FIG. 41 is a cross-sectional view showing a manufacturing step after the manufacturing step shown in FIG. 40.
Figure 42:
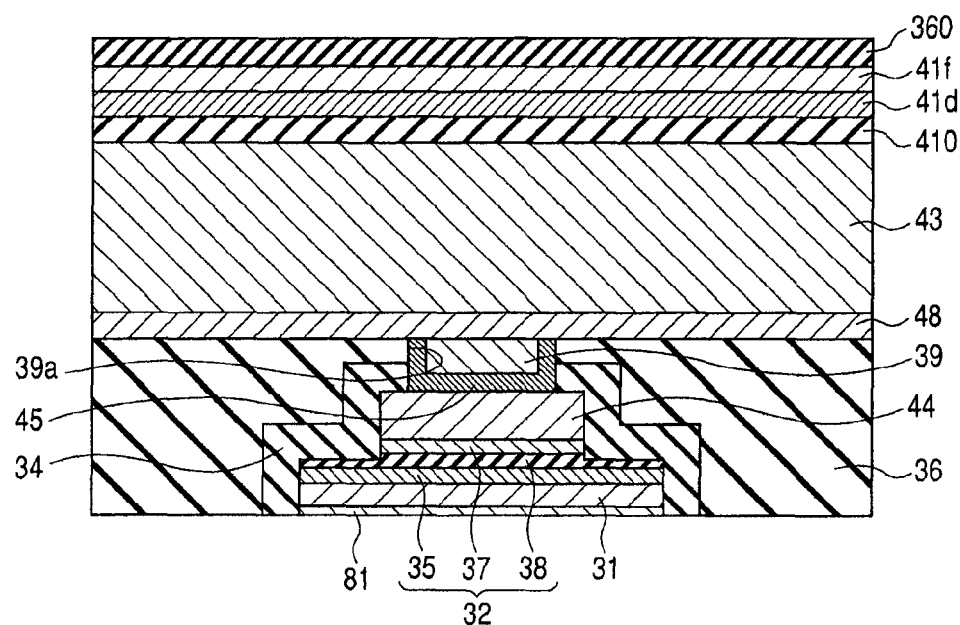
FIG. 42 is a cross sectional view as viewed in the direction intersecting with respect to FIG. 41.

Thereafter, as shown in FIG. 41, the insulating layer 360 made of a silicon oxide film or the like is formed to cover the upper surface of the barrier metal film 41f and the exposed upper surface of the liner film 410. The insulating layer 360 is formed to suppress the electrical short circuit with an external load disposed above the layer. For example, a part of the insulating layer 360 positioned around the region where the magnetoresistive elements 32 are arranged is etched to thereby form a wiring electrically coupled to an external device. By the above procedure, the magnetoresistive element 32 of the first embodiment and the semiconductor device 200 including the magnetoresistive element are completed as shown in FIGS. 41 and 42.

(Second Embodiment)

Figure 43:
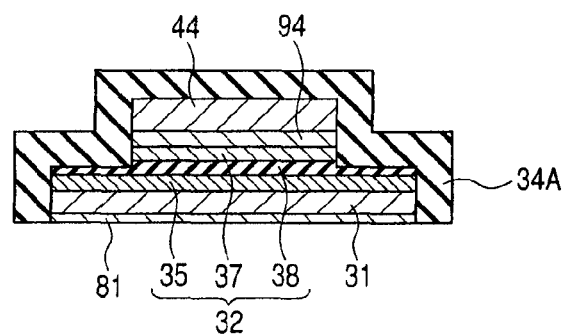
FIG. 43 is a cross-sectional view showing the form of a magnetoresistive element, an upper electrode, and a lower electrode according to a second embodiment of the invention.

The semiconductor device 200 according to a second embodiment has the substantially same structure as that of the semiconductor device 200 of the first embodiment. The second embodiment slightly differs from the first embodiment in the structure of the magnetoresistive element 32. Specifically, by comparing FIG. 43 with FIG. 28, a magnetoresistive element 32 of the second embodiment includes a second upper electrode 94 in addition to the first upper electrode 44. The magnetoresistive element 32 of the first embodiment has only the single-layered upper electrode, namely, the first upper electrode 44, but has the two-layered lower electrode, namely, the first lower electrode 31 and the second lower electrode 81. The magnetoresistive element 32 of the second embodiment, however, has two-layered structure in each of the upper electrode and the lower electrode. Thus, also the upper electrode may be comprised of two-layered structure, like the lower electrode. The second lower electrode 81 of the second embodiment is thicker than the second lower electrode 81 of the first embodiment. The second embodiment differs from the first embodiment in the above point.

The second upper electrode 94 is preferably comprised of the same material as that of the second lower electrode 81. Specifically, for example, the second upper electrode 94 is preferably made of Ru. The first upper electrode 44 is preferably comprised of, for example, Ta or TaN, as mentioned above. The first upper electrode 44 and the second upper electrode 94 are preferably comprised of materials having high etching selectivity to each other. The second upper electrode 94 preferably has a thickness of, for example, not less than 3 nm nor more than 15 nm, and more preferably, not less than 4 nm nor more than 10 nm. The second lower electrode 81 is preferably thicker by the thickness of the second upper electrode 94 than that of the second lower electrode 81 of the first embodiment. Specifically, for example, the second lower electrode 81 preferably has a thickness of not less than 4 nm nor more than 24 nm, and more preferably not less than 5 nm nor more than 19 nm.

Thus, the first upper electrode 44 and the first lower electrode 31 are comprised of the same material, and the second electrode 94 is comprised of the same material as that of the second lower electrode 81, whereby the laminated structure of the lower electrode is the same as that of the upper electrode.

A manufacturing method of the semiconductor device 200 according to the second embodiment can be described with reference to the flowchart of FIG. 44 together with the flowchart of FIG. 7. For example, the step of preparing the base wiring shown in FIG. 7 (S00) in this embodiment is in conformity with that in the first embodiment. As shown in FIG. 45, in the step of forming the laminated structure shown in FIG. 7 (S10), the conductive film 94A is formed to be sandwiched between the conductive film 37A and the conductive film 44A. This is a layer to serve as the second upper electrode 94. Thus, the conductive film 94A is preferably formed by depositing a thin film comprised of the same material as that of the conductive film 81A in the thickness of the above second upper electrode 94. The second lower electrode 81 preferably has a thickness of not less than 4 nm nor more than 24 nm (and more preferably, not less than 5 nm nor more than 19 nm).

In the step of performing etching so as to set the size of the magnetoresistive element as shown in FIG. 7 (S20), the resist 99 is first applied to the conductive film 44A, and subjected to the photolithography, whereby the conductive film 44A is etched into the size of a planar shape (the size as viewed in a planar manner) of the lower electrode to be finally formed. The etching of the lower electrode provides electrical isolation between the respective magnetoresistive elements to be finally formed. As a result, the conductive film 44A becomes a conductive film 44B shown in FIG. 46. The etching gas used at this time is preferably a mixed gas of $CF_4$ and Ar.

Figure 47:
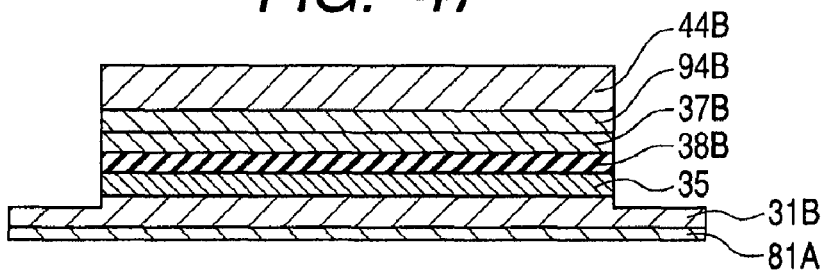
FIG. 47 is a cross-sectional view showing a manufacturing step after the manufacturing step shown in FIG. 46.

After forming the conductive film 44B, the resist 99 is removed by the $NH_3$ gas. Then, etching is continued while switching the etching gas to a mixed gas of CO and $NH_3$ gas. Parts (upper sides) of the conductive film 94A, the conductive film 37A, the insulating film 38A, the conductive film 35A, and the conductive film 31A under the conductive film 44B are etched to thereby form the conductive film 94B, the conductive film 37B, the insulating film 38B, the magnetization fixed layer 35, and the conductive film 31B, respectively, as shown in FIG. 47.

Figure 48:
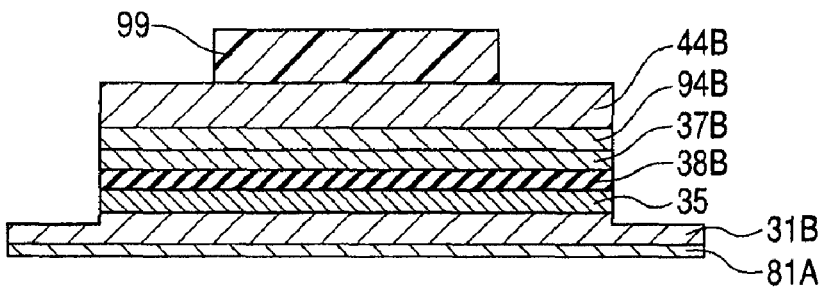
FIG. 48 is a cross-sectional view showing a manufacturing step after the manufacturing step shown in FIG. 47.
Figure 49:
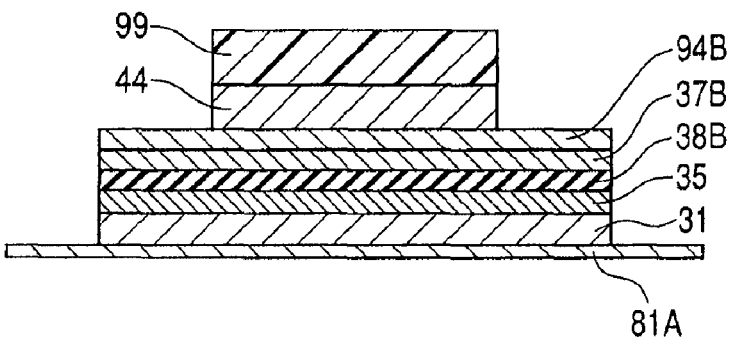
FIG. 49 is a cross-sectional view showing a manufacturing step after the manufacturing step shown in FIG. 48.

Then, as shown in FIG. 48, a resist 99 is applied over the conductive film 44B, and subjected to the photolithography, whereby the conductive film 44B is etched into the size of a planar shape of the first upper electrode 44 to be finally formed. At this time, as shown in FIG. 49, the conductive film 44B and the conductive film 31B are simultaneously etched, so that the first lower electrode 31 having the same size as the magnetization fixed layer 35 is formed. The conductive film 44B and the conductive film 94B are comprised of materials having high etching selectivity to each other. When the etching proceeds up to the lowermost end of the conductive film 44B to stop the etching, the conductive film 94B under the film 44B is not etched. This is the same as the case where the etching is stopped upon etching of the lowermost end of the conductive film 31B, while the conductive film 81A under the film 31B is not etched any more because of the high etching selectivity between the conductive film 31B and the conductive film 81A under the film 31B.

Figure 44:
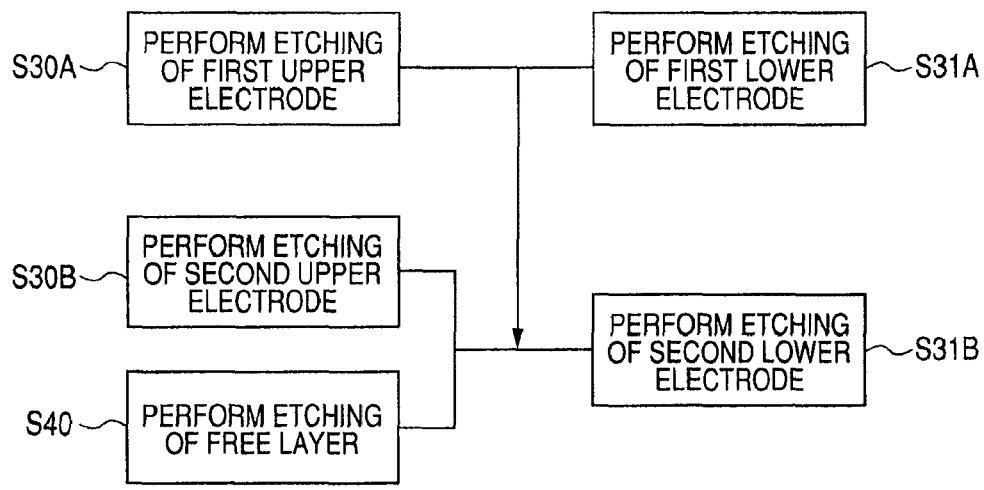
FIG. 44 is a flowchart especially showing different points from the first embodiment in a manufacturing method of the semiconductor device according to the second embodiment.
Figure 45:
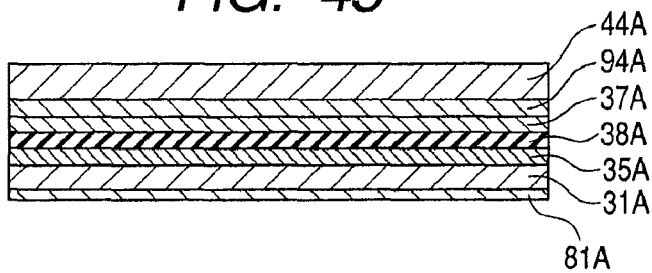
FIG. 45 is a cross-sectional view corresponding to FIG. 22 in the second embodiment.

The process for forming the first upper electrode 44 by etching the conductive film 44B and the process for forming the first lower electrode 31 by etching the conductive film 31B as shown in FIG. 49 are simultaneously performed in steps, which are represented by the step (S30A) of forming the first upper electrode by etching, and the step (S31A) of forming the first lower electrode by etching in the flowchart of FIG. 44.

Figure 50:
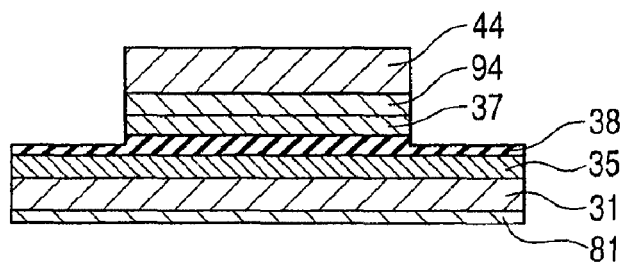
FIG. 50 is a cross-sectional view showing a manufacturing step after the manufacturing step shown in FIG. 49.

Then, as shown in FIG. 50, the resist 99 is removed by $NH_3$ gas, and the conductive films 94B and the conductive film 37B are etched. The etching gas at this time is preferably a mixed gas of CO and $NH_3$ gas. At this time, the conductive film 37B, the conductive film 94B, and the conductive film 81A are simultaneously etched to thereby form the second upper electrode 94 and the magnetization free layer 37 having the same planar size as that of the first upper electrode 44, and the second lower electrode 81 having the same planar size as that of the first lower electrode 31. As shown in FIG. 50, a part (upper side) of the insulating film 38B may be etched at the same time to form the tunneling insulating film 38 with the stepped portion.

As shown in FIG. 50, the process for forming the second upper electrode 94 by etching the conductive film 94B, the process for forming the magnetization free layer 37 by etching the conductive film 37B, and the process for forming the second lower electrode 81 by etching the conductive film 81A are simultaneously performed in steps, which are represented by the step (S30B) of forming the second upper electrode by etching, the step (S40) of forming the free layer by etching, and the step (S31) of forming the lower electrode by etching as shown in the flowchart of FIG. 44. Thereafter, referring to the flowchart of FIG. 7, the step (S50) for forming the protective film like the first embodiment, and the step (S60) for forming wirings above the magnetoresistive element are performed.

For example, like the first embodiment, in a case where the upper electrode is comprised of the single-layered first upper electrode 44, in the step (S30) of forming the upper electrode by etching as shown in the flowchart of FIG. 7, the conductive film 37B under the first upper electrode 44 and the insulating film 38B under the film 37B can be damaged when the first lower electrode 31 is simultaneously formed together with the first upper electrode 44 as shown in FIG. 26. In contrast, like the second embodiment, the second upper electrode 94 is held under the first upper electrode 44 as the upper electrode. In the step of forming the first upper electrode by etching (S30A) in the flowchart of FIG. 44, the presence of the conductive film 94B can reduce the process damage on the conductive film 37B under the first upper electrode 44 and the insulating film 38B under the film 37B as shown in FIG. 49. Thereafter, it is assumed that the step (S30B) of forming the second upper electrode by etching and the step (S40) of forming the free layer by etching are continuously performed. Thus, also, in the step (S30B), the damage on the magnetization fixed layer 35 is reduced, which can improve the quality of the magnetization free layer 37, the tunneling insulating film 38, and the magnetization fixed layer 35 thus formed.

The upper electrode and the lower electrode of the second embodiment are comprised of the same material as that of the first upper electrode 44 and the first lower electrode 31, and the second upper electrode 94 is comprised of the same material as that of the second lower electrode 81. In other words, as shown in FIG. 45, the two layers to serve as the lower electrode and the two layers to serve as the upper electrode are structured such that the same material is laminated in the same order in the lamination direction (vertical direction shown in FIG. 45). More specifically, as shown in FIG. 45, the conductive film 31A made of Ta or TaN is formed over the conductive film 81A made of Ru, and the conductive film 44A made of Ta or TaN is formed over the conductive film 94A made of Ru.

In this way, the upper electrode and the lower electrode are caused to have the identical order of lamination of material groups. Thus, the etching can be simultaneously performed on the upper layer of the lower electrode (layer to serve as the first lower electrode 31) to the lower layer thereof (layer to serve as the second lower electrode 81) in etching on the upper layer of the upper electrode (layer to serve as the first upper electrode 44) to the lower layer thereof (layer to serve as the second lower electrode 94).

As mentioned above, the upper electrode and the lower electrode are comprised of the same material. The same materials (having a small etching selectivity to each other) as those of the magnetization fixed layer 35 or magnetization free layer 37 are used for the upper electrode and the lower electrode, which can reduce costs for a device for formation of the layers of the upper electrode and the lower electrode, or costs for management of the device. This will be explained below.

Generally, the thin film included in the magnetoresistive element 32 is a metal film. All thin films included also in the upper electrode and the lower electrode, except for the tunneling insulating film 38, are metal films. The metal films do not have preferably oxidized. This is from the viewpoint of reducing the peeling of the film, and reducing variations in magnetic characteristics between the adjacent magnetoresistive elements 32. The formation of the protective film 34 made of a nitride of each metal film is based on such a reason, which has been described above.

In order to suppress the surface oxidation of the metal film, the laminated structure shown in FIG. 45 is preferably formed by use of a dedicated deposition device (for example, the above-mentioned sputtering device 170) while ensuring a vacuum state. The same goes for not only the magnetization fixed layer 35 and the magnetization free layer 37 of the magnetoresistive element 32, but also the upper electrode and the lower electrode. For example, the upper electrode is preferably formed without being oxidized in order to suppress the oxidation of the magnetization free layer 37 disposed under the upper electrode. The lower electrode is preferably formed without being oxidized in order to suppress variations in crystallinity of the seed layer 35$p$ formed on the lower electrode. This is because the oxidation of the seed layer 35$p$ leads to variations in crystallinity of the seed layer 35$p$, resulting in possibility of disturbance of the crystalline orientation of the antiferromagnetic layer 35$q$ over the seed layer 35$p$. The seed layer 35$p$ serves to control the crystalline orientation of the antiferromagnetic layer 35$q$.

Since the laminated structure shown in FIG. 45 is consistently formed, the number of kinds of targets (deposition materials) to be mounted on a deposition device in deposition is preferably decreased. This is because the number of kinds of the targets that can be temporarily mounted on the deposition device is limited. The number of kinds of the targets can be lessened by selecting materials for forming the upper electrode and lower electrode from among materials forming the respective layers of the magnetoresistive element 32. Thus, the number of kinds of deposition materials prepared is lessened to enable reduction of management items, and costs for the device and management of the device.

The second embodiment of the invention differs from the first embodiment of the invention only in the following points. That is, the structure, conditions, procedure, and effects not described above of the second embodiment of the invention is in conformity with those of the first embodiment of the invention. That is, the second embodiment includes the same effects of the first embodiment, and the effects described in the second embodiment are effects associated with the effects of the first embodiment.

(Third Embodiment)

Figure 51:
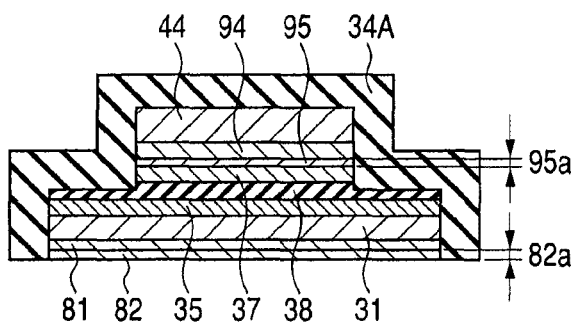
FIG. 51 is a cross-sectional view showing the form of a magnetoresistive element, an upper electrode, and a lower electrode according to a third embodiment of the invention.

A semiconductor device 200 of the third embodiment includes substantially the same structure as that of the semiconductor device 200 of the second embodiment, but includes a few differences of the magnetoresistive element 32 from that of the second embodiment. Specifically, by comparing FIG. 51 with FIG. 43, the magnetoresistive element 32 of the third embodiment includes a third upper electrode 95 in addition to the first upper electrode 44 and the second upper electrode 94. The semiconductor device 200 of this embodiment includes a third lower electrode 82, in addition to the first lower electrode 31 and the second lower electrode 81. In the magnetoresistive element 32 of the second embodiment, the upper electrode has a two-layered structure of the first upper electrode 44 and the second upper electrode 94, and the lower electrode has a two-layered structure of the first lower electrode 31 and the second lower electrode 81. In the magnetoresistive element 32 of the third embodiment, however, each of the upper electrode and the lower electrode has a three-layered structure. Thus, at least one of the upper electrode and the lower electrode may have a laminated structure of three or more layers. In the above points, the third embodiment differs from the second embodiment.

A third upper electrode 95 is preferably comprised of the same material as that of the third lower electrode 82. Preferably, the third upper electrode 95 is comprised of the same material of the first upper electrode 44, and the third lower electrode 82 is comprised of the same material of the first lower electrode 31. The first upper electrode 44 and the first lower electrode 31 are preferably comprised of, for example, Ta or TaN, as mentioned above. The second upper electrode 94 and the third upper electrode 95 are preferably comprised of the materials having high etching selectivity to each other. Also, the second lower electrode 81 and the third lower electrode 82 are preferably comprised of the materials having high etching selectivity to each other.

Specifically, the third upper electrode 95 and the third lower electrode 82 are preferably comprised of, for example, Ta or TaN. The third upper electrode 95 preferably has a thickness of not less than 0.5 nm nor more than 2 nm, and more preferably, not less than 1 nm nor more than 1.5 nm. The thickness 82$a$ of the third lower electrode 82 is preferably larger than the thickness 95$a$ of the third upper electrode 95. Specifically, for example, the third lower electrode 82 preferably has a thickness of not less than 0.5 nm nor more than 3 nm, and more preferably, not less than 1.5 nm nor more than 2 nm.

The third upper electrode 95 and the third lower electrode 82 are comprised of the same material, and the first upper electrode 44 (second upper electrode 94) is comprised of the same material as that of the first lower electrode 31 (second lower electrode 81). The laminated structure of the lower electrode is the same as the laminated structure of the upper electrode.

A manufacturing method of the semiconductor device 200 according to the third embodiment can be described below referring to the flowchart of FIG. 52 with the flowchart of FIG. 7. For example, the step of preparing the base wiring shown in FIG. 7 (S00) in this embodiment is in conformity with that in the first and second embodiments. As shown in FIG. 53, in the step of forming the laminated structure shown in FIG. 7 (S10), the conductive film 95A is formed to be sandwiched between the conductive film 37A and the conductive film 94A. The conductive film 95A is the layer to serve as the third upper electrode 95. A conductive film 82A is formed under the conductive film 81A, which is a layer to serve as the third lower electrode 82. Thus, the conductive film 95A is preferably formed by depositing a thin film comprised of the same material as that of the conductive film 44A and the conductive film 31A in the thickness of the above third upper electrode 95. The conductive film 82A is preferably formed by depositing a thin film comprised of the same material as that of the conductive film 44A and the conductive film 31A in the thickness of the above third lower electrode 82.

Figure 46:
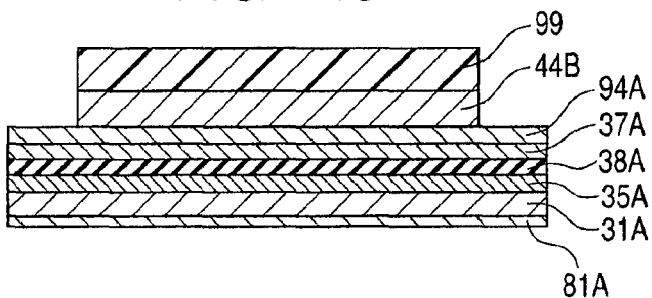
FIG. 46 is a cross-sectional view showing a manufacturing step after the manufacturing step shown in FIG. 45.
Figure 54:
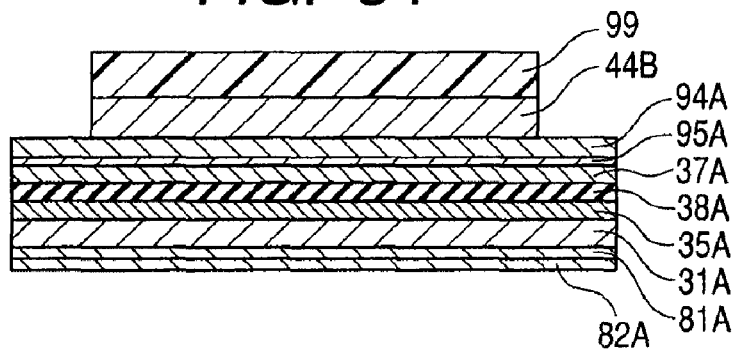
FIG. 54 is a cross-sectional view showing a manufacturing step after the manufacturing step shown in FIG. 53.
Figure 55:
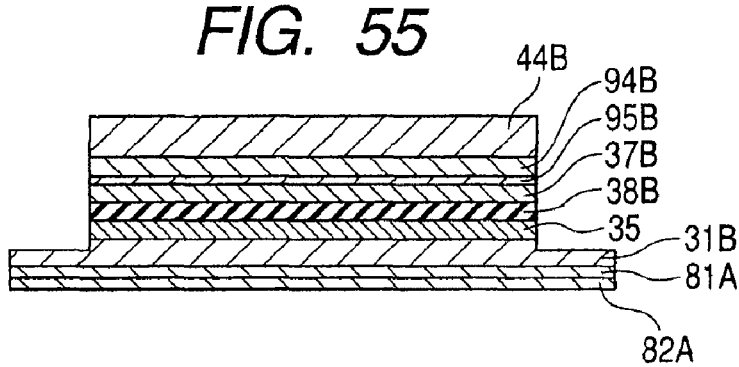
FIG. 55 is a cross-sectional view showing a manufacturing step after the manufacturing step shown in FIG. 54.

In the step (S20) of performing etching so as to set the size of the magnetoresistive element shown in FIG. 7, first, as shown in FIG. 54, the resist 99 is applied over the conductive film 44A, and subjected to the lithography and etching in the same way as that shown in FIG. 46. As a result, the conductive film 44A becomes the conductive film 44B shown in FIG. 54. As shown in FIG. 55, the etching gas is switched and the etching is continued in the same way as that shown in FIG. 47 to thereby form the conductive film 94B, the conductive film 95B, the conductive film 37B, the insulating film 38, the magnetization fixed layer 35, and the conductive film 31B.

The conductive film 94A and the conductive film 95A are comprised of the materials having high etching selectivity to each other in etching. Thus, even the use of the etching gas for the conductive film 94A makes it difficult to etch the conductive film 95A. When the etching of the conductive film 94A is finished to reach the conductive film 94B, the conductive film 95A under the conductive film 94B starts to be etched by the physical milling action. For this reason, as mentioned above, the conductive film 95A is preferably thin (as compared to the conductive film 82A).

Figure 56:
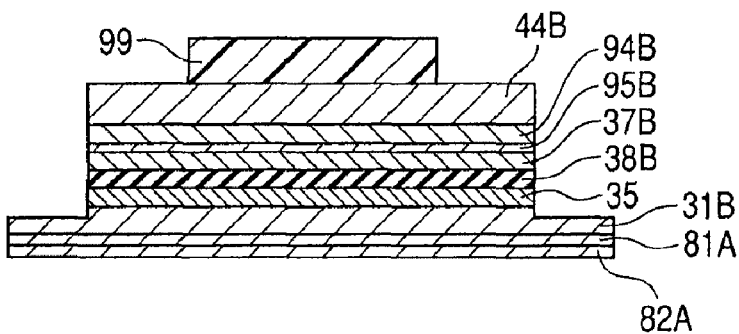
FIG. 56 is a cross-sectional view showing a manufacturing step after the manufacturing step shown in FIG. 55.
Figure 57:
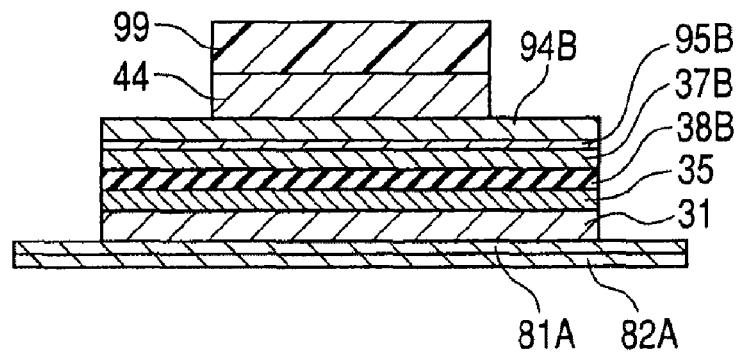
FIG. 57 is a cross-sectional view showing a manufacturing step after the manufacturing step shown in FIG. 56.

Then, as shown in FIG. 56, the resist 99 is applied to the conductive film 44B, and subjected to the photolithography and etching in the same way as that shown in FIG. 48 such that the conductive film 44B becomes the first upper electrode 44. At this time, as shown in FIG. 57, the conductive film 44B and the conductive film 31B are simultaneously etched in the same way as that shown in FIG. 49, whereby the first lower electrode 31 having the same size as the magnetization fixed layer 35 is formed. The conductive film 44B and the conductive film 94B under the film 44B are comprised of materials having high etching selectivity. Thus, the etching is ended when it reaches the lowermost end of the conductive film 44B, so that the conductive film 94 thereunder is not etched.

Figure 52:
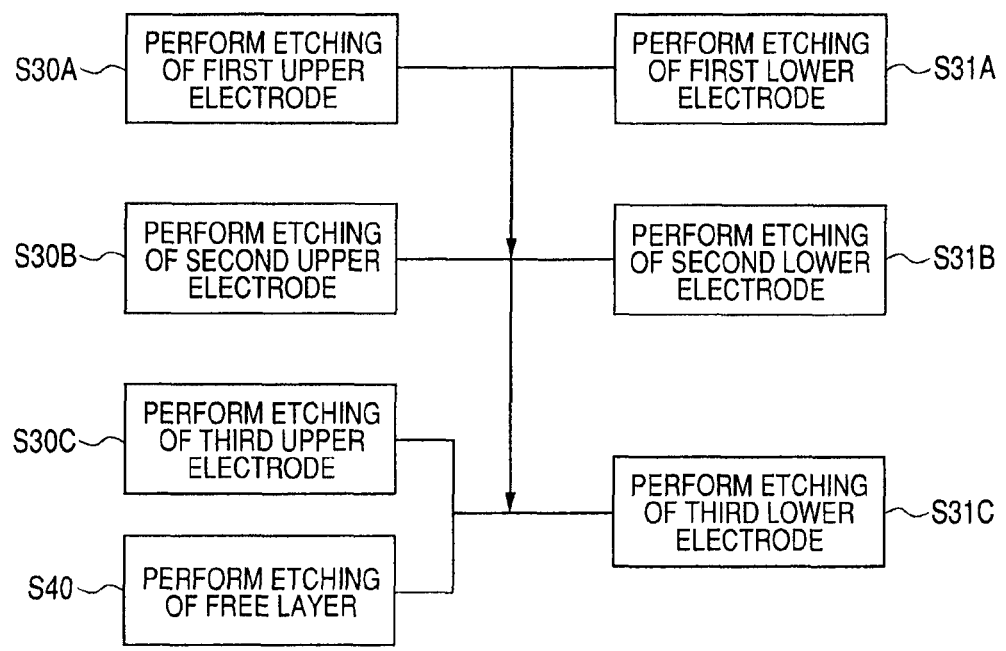
FIG. 52 is a flowchart especially showing different points from the first embodiment in a manufacturing method of the semiconductor device according to the third embodiment.
Figure 53:
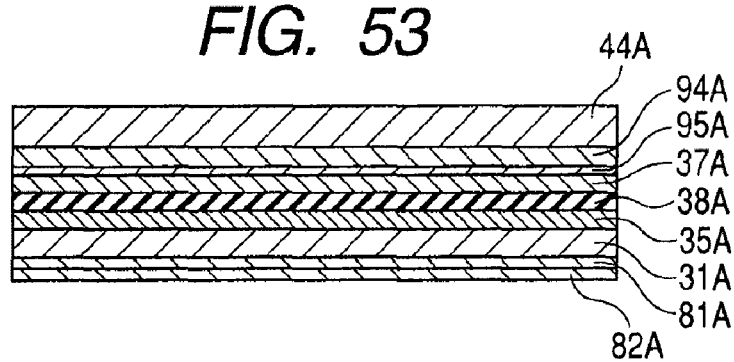
FIG. 53 is a cross-sectional view corresponding to FIG. 22 in the third embodiment.

The process for forming the first upper electrode 44 by etching the conductive film 44B and the process for forming the first lower electrode 31 by etching the conductive film 31B as shown in FIG. 57 are simultaneously performed in steps, which are represented by the step (S30A) of forming the first upper electrode by etching and the step (S31A) of forming the first lower electrode by etching in the flowchart of FIG. 52.

Figure 58:
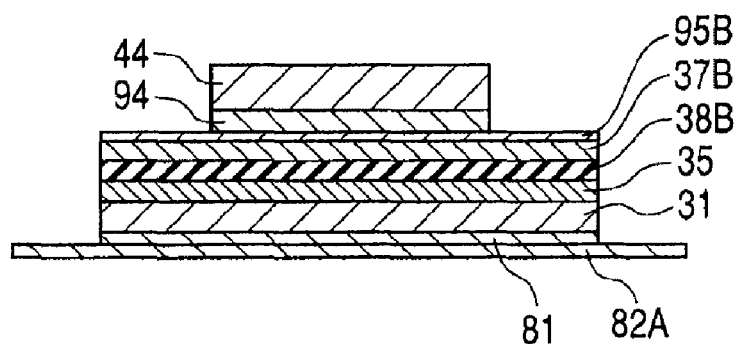
FIG. 58 is a cross-sectional view showing a manufacturing step after the manufacturing step shown in FIG. 57.

Then, as shown in FIG. 58, after removing the resist 99 by $NH_3$ gas, the etching gas is switched to a mixed gas of CO and $NH_3$ gas, and the conductive film 94B and the conductive film 81A are etched to thereby form the second upper electrode 94 and the second lower electrode 81. The process for forming the second upper electrode 94 by etching the conductive film 94B and the process for forming the second lower electrode 81 by etching the conductive film 81A as shown in FIG. 58 are simultaneously performed in steps, which are represented by the step (S30B) of forming the second upper electrode by etching and the step (S31B) of forming the second lower electrode by etching in the flowchart of FIG. 52.

Figure 59:
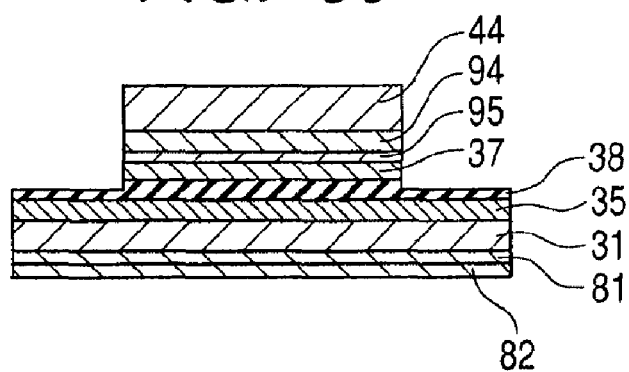
FIG. 59 is a cross-sectional view showing a manufacturing step after the manufacturing step shown in FIG. 58.

Then, as shown in FIG. 59, the conductive film 95B and the conductive film 37B, and the conductive film 82A are etched to thereby form the third upper electrode 95, the magnetization free layer 37, and the third lower electrode 82. At this time, as shown in FIG. 59, a part (upper side) of the insulating film 38B may be simultaneously etched to form the tunneling insulating film 38 with a stepped portion.

At this time, the conductive film 95B and the conductive film 82A are etched by use of the physical milling action using a mixed gas of CO and $NH_3$ gas in the same way as in the step (S30B) and the step (S31B) without switching the etching gas. Since the conductive film 94B and the conductive film 95B (conductive film 81A and conductive film 82A) have the high etching selectivity to each other, it takes much time to etch the conductive film 95B using the gas for etching the conductive film 94B. During this time, reactive deposited materials formed or attached to side walls of each of the magnetization fixed layer 35, the first upper electrode 44, and the second upper electrode 94 formed by etching can be simultaneously etched.

When the above reactive deposited materials are attached to the side walls of the formed metal films, the deposited materials work as a mask at the time of the photolithography of the layers with the deposited materials attached thereto described below, which can make it difficult to control the shape of these layers by the process. Thus, the deposited materials are preferably removed. Like the third embodiment, the third upper electrode 95 comprised of the high etching selectivity to the second upper electrode 94 is disposed under the second upper electrode 94. Etching is performed using the same gas as the etching gas for forming the second upper electrode 94 to thereby form the third upper electrode 95. Thus, the deposited materials can be effectively removed, which can improve the accuracy of shape of the formed magnetoresistive element 32 and the upper and lower electrodes. This can surely suppress the inconveniences, including oxidation of the magnetoresistive element 32, the upper and lower electrodes, the leakage of the magnetic field, and the like.

As mentioned above, the conductive film 82A is etched during the time of etching the conductive films 95B and 37B. Thus, the conductive film 82A is preferably thicker than the conductive film 95A.

As shown in FIG. 59, the process for forming the third upper electrode 95 by etching the conductive film 95B, the process for forming the magnetization free layer 37 by etching the conductive film 37B, and the process for forming the third lower electrode 82 by etching the conductive film 82A are simultaneously performed in steps, which are represented by the step (S30C) of forming the third upper electrode by etching, the step (S40) of forming the free layer by etching, and the step (S31C) of forming the third lower electrode by etching in the flowchart of FIG. 52. Thereafter, the step (S50) of forming a protective film, and the step (S60) of forming the upper wiring of the magnetoresistive element are performed in the same way as that of the first and second embodiments according to the flowchart of FIG. 7.

The third embodiment of the invention differs from the second embodiment of the invention only in the points described above. That is, the structure, conditions, procedure, and effects not described above of the third embodiment of the invention is in conformity with those of the second embodiment of the invention. That is, the third embodiment includes the same effects of the second embodiment, and the effects described in the third embodiment are associated with the effects of the second embodiment.

(Fourth Embodiment)

The semiconductor device 200 according to the fourth embodiment has the substantially same structure as that of the semiconductor device 200 of the first embodiment. The fourth embodiment slightly differs from the first embodiment in the structure of the magnetoresistive element 132. Specifically, by comparing FIG. 60 with FIG. 28, in the magnetoresistive element 32 of the fourth embodiment, the lower electrode is comprised of only one layer of the first lower electrode 31. In the magnetoresistive element 32 of the first embodiment, the upper electrode is comprised of only one layer of the crystal first upper element 44, and the lower electrode is comprised of two layer of the first lower electrode 31 and the second electric electrode 81. In the magnetoresistive element 32 of the fourth embodiment, however, each of the upper electrode and the lower electrode has a single-layered structure. Thus, even the lower electrode may have a single-layered structure, like the upper electrode.

The thickness 31a of the first lower electrode 31 is larger than the thickness 44a of the first upper electrode 44. Specifically, the first upper electrode 44 preferably has a thickness of, for example, not less than 30 nm nor more than 70 nm (more preferably, not less than 35 nm nor more than 65 nm) like the first embodiment. The first lower electrode 31 has a thickness of not less than 32 nm nor more than 80 nm, and more preferably not less than 37 nm nor less than 75 nm. In the above description, the fourth embodiment differs from the first embodiment.

Figure 60:
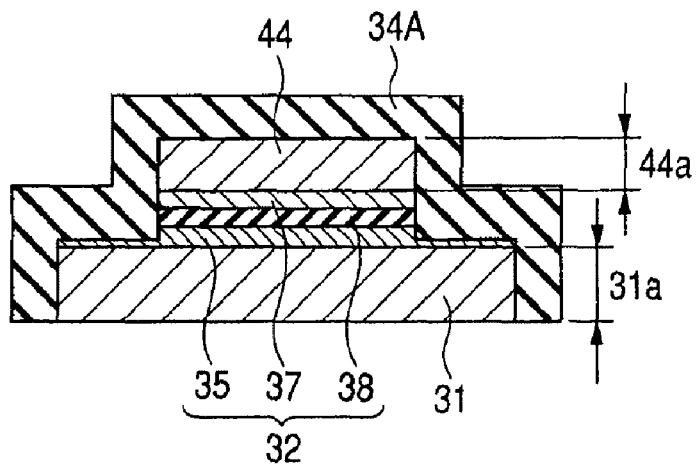
FIG. 60 is a cross-sectional view showing the form of a magnetoresistive element, an upper electrode, and a lower electrode according to a fourth embodiment of the invention.

In any one of the first to third embodiments, at least one of the upper electrode and the lower electrode has two or more layered lamination structure. Like the fourth embodiment, however, both the upper electrode and the lower electrode may have a single-layered structure. Also, in this case, as shown in FIG. 60, the width of each of the first upper electrode 44 and the magnetization free layer 37 is smaller than that of the first lower electrode 31, and the protective film 34A(34) is provided, which can prevent the magnetic field of the magnetization fixed layer 35 from interfering with the magnetization free layer 37, and can improve the stability of the operation of the magnetoresistive element 32 by use of the protective film 34. Thus, the invention can provide the semiconductor device 200 having the stable operation properties.

Figure 61:
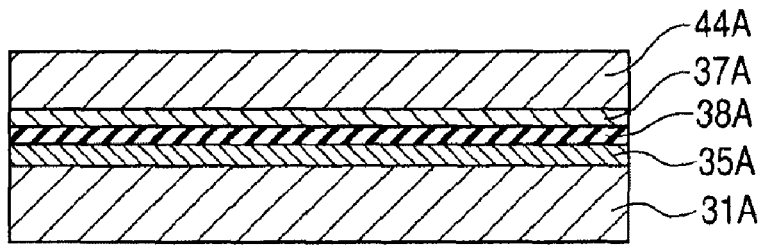
FIG. 61 is a cross-sectional view corresponding to FIG. 22 in the fourth embodiment.

The manufacturing method of the semiconductor device 200 according to the fourth embodiment is the same as the manufacturing method of the semiconductor device 200 according to the first to third embodiments, and thus can be described with reference to the flowchart of FIG. 7. For example, the step (S00) of preparing the base wiring as shown in FIG. 7 is in conformity with that in the first embodiment. In the step (S10) of forming the laminated structure shown in FIG. 7, as shown in FIG. 61, the laminated structure without the conductive film 81A is formed, unlike FIG. 22. The conductive film 31A is a layer to serve as the first lower electrode 31, and the conductive film 44A is a layer to serve as the first upper electrode 44. The conductive film 31A is thicker than the conductive film 44A, and has a thickness not less than 32 nm nor more than 80 nm (more preferably, not less than 37 nm nor more than 75 nm).

Figure 62:
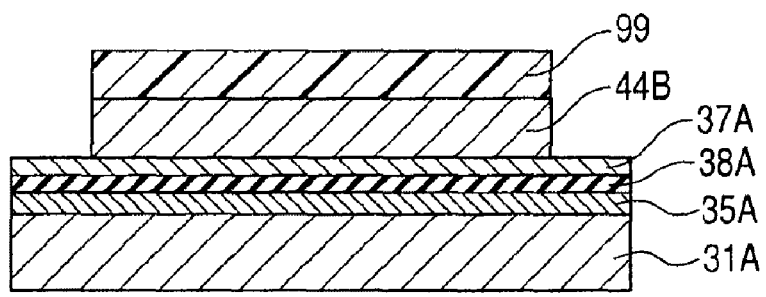
FIG. 62 is a cross-sectional view showing a manufacturing step after the manufacturing step shown in FIG. 61.
Figure 63:
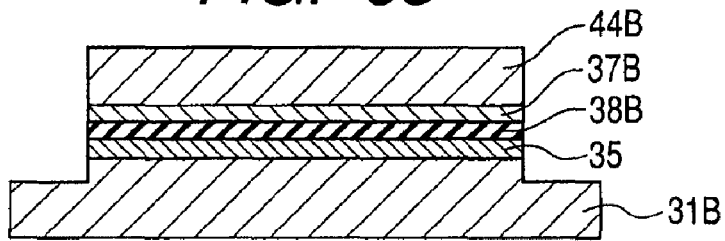
FIG. 63 is a cross-sectional view showing a manufacturing step after the manufacturing step shown in FIG. 62.

In the step (S20) of performing etching so as to set the size of the magnetoresistive element shown in FIG. 7, first, as shown in FIG. 62, the resist 99 is applied over the conductive film 44A, and subjected to the lithography, whereby the etching is performed such that the conductive film 44A becomes a conductive film 44B having the planar size (the size as viewed in a planar manner) of the lower electrode to be finally formed. The resist 99 is removed, and etching is further continued after the etching gas is switched, which provides the conductive film 37B, the insulating film 38B, the magnetization fixed layer 35, and the conductive film 31B as shown in FIG. 63.

Figure 64:
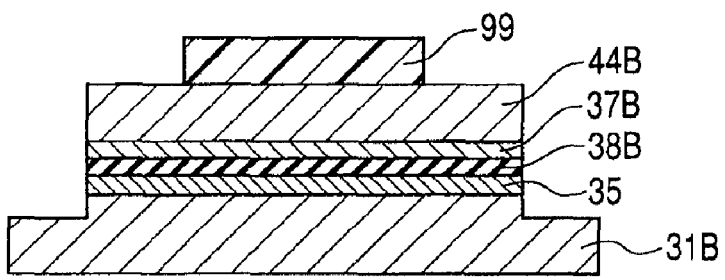
FIG. 64 is a cross-sectional view showing a manufacturing step after the manufacturing step shown in FIG. 63.
Figure 65:
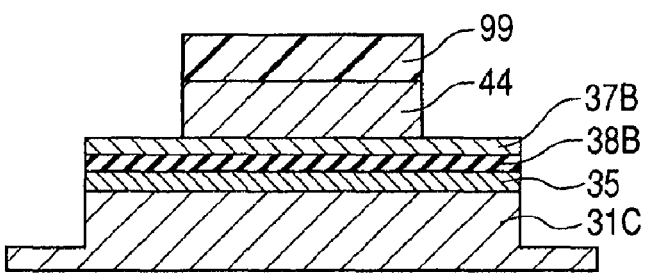
FIG. 65 is a cross-sectional view showing a manufacturing step after the manufacturing step shown in FIG. 64.

Then, as shown in FIG. 64, the resist 99 is applied to the conductor film 44B, and subjected to the lithography, whereby the resist is etched so as to have the size of the first upper electrode 44, using the same gas as that of the etching of the conductive film 44A as shown in FIG. 65. At this time, as shown in FIG. 65, the conductive film 44B and the conductive film 31B are simultaneously etched, so that the conductive film 31B becomes the conductive film 31C. This corresponds to the step (S30) of forming the upper electrode by etching, and the step (S31) of forming the lower electrode by etching.

Figure 66:
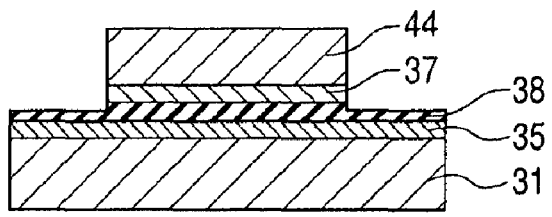
FIG. 66 is a cross-sectional view showing a manufacturing step after the manufacturing step shown in FIG. 65.

As shown in FIG. 66, after the resist 99 is removed by $NH_3$ gas, the conductive film 37B is etched. The etching gas at this time is preferably a mixed gas of CO and $NH_3$. Although the conductive film 37B and the conductive film 31C are made of materials having high etching selectivity to each other as shown in FIG. 65, the conductive film 31C is also etched by the physical milling action at the same time as the conductive film 37B. As a result, the magnetization free layer 37 and the first lower electrode 31 are formed as shown in FIG. 66. At this time, a part (upper side) of the insulating film 38B may be simultaneously etched, and thus the tunneling insulating film 38 with the stepped portion may be formed. The step corresponds to the step of forming the free layer by etching (S40) and the step of forming the lower electrode by etching (S31) as shown in the flowchart of FIG. 7.

As mentioned above, the step (S31) of forming the lower electrode by etching is performed at the same time as the time of both the step (S30) of forming the upper electrode by etching and the step (S40) of forming the free layer by etching. Thus, the conductive film 31A to serve as the first lower electrode 31 is preferably thicker than that of the conductive film 44A, which is a layer to serve as the first upper electrode 44.

The conductive film 31A is thicker than the conductive film 44A, so that as shown in FIG. 65, when the etching of the conductive film 44B is finished to form the first upper electrode 44, the conductive film 31B becomes the conductive film 31C having a region on the lower side viewed in a planar manner which is larger than the magnetization fixed layer 35. Thus, this region serves to avoid the problem of simultaneously etching the insulating film under the insulating film 31C when the magnetization free layer 37 is formed by etching the following insulating film 37B. Thus, by making the conductive film 31A thicker than the conductive film 44A in the fourth embodiment, the damage onto the connection wiring 8 can be suppressed when the interlayer insulating film 9 or the like under the lower electrode is etched like the first embodiment.

After the step shown in FIG. 66, the step of forming the protective film (S50), and the step of forming the wiring above the magnetoresistive element (S60) are performed according to the flowchart shown in FIG. 7 like the first embodiment. The protective film 34A is formed after the etching for forming the magnetoresistive element 32 is finished, which can reduce the possibility of damage on the protective film 34A by etching in the following steps. This is the same as the first embodiment.

COMPARATIVE EXAMPLES

The structure of the magnetoresistive element 32 and the manufacturing method thereof will be described below by taking the following comparative examples for reference corresponding to the semiconductor device 200 of each of the first to fourth embodiments.

Figure 67:
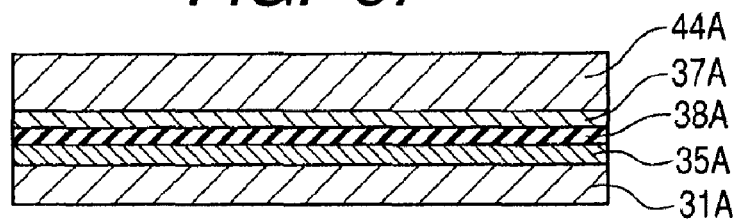
FIG. 67 is a cross-sectional view corresponding to FIG. 22 in a comparative example of the invention.

For example, when the laminated structure of the magnetoresistive element 32, the upper electrode, and the lower electrode is formed, the same laminated structure as that of the conductive films of the fourth embodiment shown in FIG. 61 is prepared as shown in FIG. 67, whatever the thickness of the conductive films 44A and 31A may be.

Figure 68:
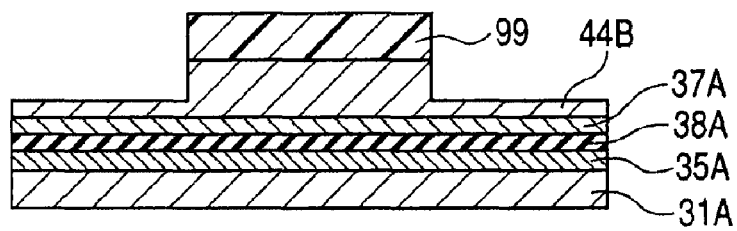
FIG. 68 is a cross-sectional view showing a manufacturing step after the manufacturing step shown in FIG. 67.
Figure 69:
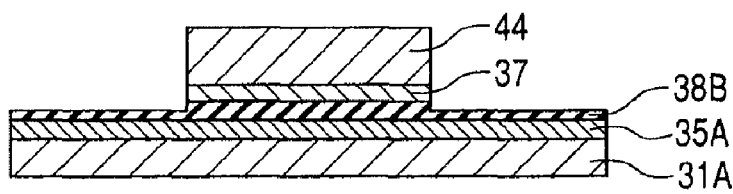
FIG. 69 is a cross-sectional view showing a manufacturing step after the manufacturing step shown in FIG. 68.

As shown in FIG. 68, the resist 99 is applied over the conductive film 44A, and subjected to the photolithography and etching, so that, as show in FIG. 69, the conductive film 44A is processed into a desired planar shape of the first upper electrode 44 through the conductive film 44B shown in FIG. 68. At this time, the etching gas that can perform etching at a high etching rate to form the first upper electrode 44 is used.

Then, as shown in FIG. 69, the conductive film 37A is etched using an etching gas that enables etching at a high etching rate to form the magnetization free layer 37 having the same size as that of the first upper electrode 44. At this time, a part of the insulating film 38A may be etched to form the insulating film 38B.

Figure 70:
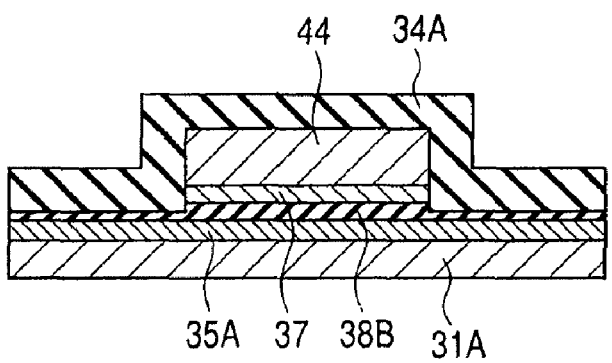
FIG. 70 is a cross-sectional view showing a manufacturing step after the manufacturing step shown in FIG. 69.

Then, as shown in FIG. 70, the protective film 34A is formed so as to cover the upper surface and sides of the first upper electrode 44, the sides of the magnetization free layer 37, and the parts of the upper surface and sides of the insulating film 38B formed as shown in FIG. 69.

Figure 71:
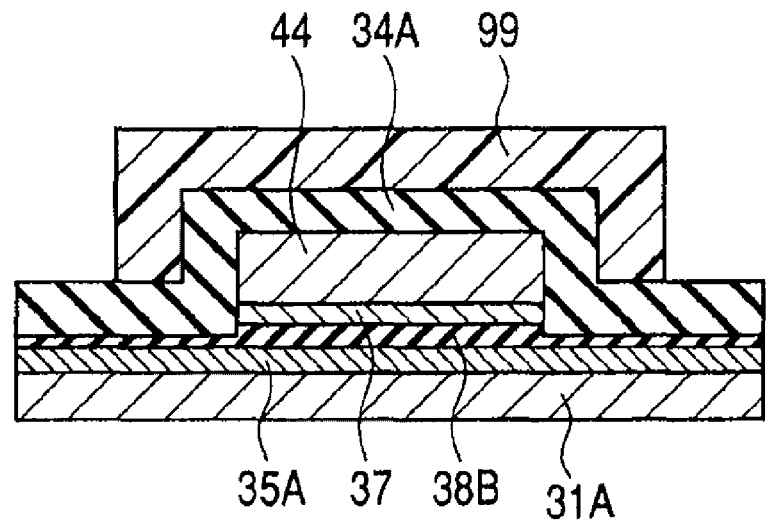
FIG. 71 is a cross-sectional view showing a manufacturing step after the manufacturing step shown in FIG. 70.
Figure 72:
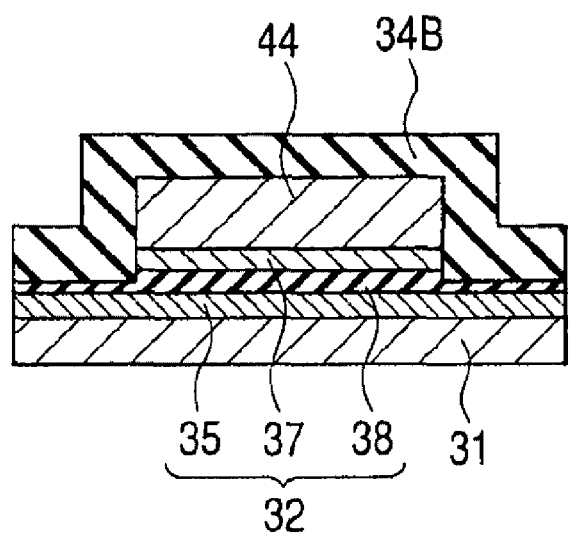
FIG. 72 is a cross-sectional view showing a manufacturing step after the manufacturing step shown in FIG. 71.

As shown in FIG. 71, the resist 99 is applied over the protective film 34A, and subjected to the photolithography and etching, whereby the protective film 34A, the insulating film 38B, and the conductive films 35A and 31A are processed into the protective film 34B, the tunneling insulating film 38, the magnetization fixed layer 35, and the first lower electrode 31 as shown in FIG. 72.

As mentioned above, in the manufacturing method of the comparative example, after processing the upper electrode into a desired shape, a protective film is formed in advance, and then a lower electrode and a magnetization fixed layer are processed together with the protective film. Thus, the protective film is not formed on the side of the magnetization fixed layer 35 to be finally formed. As a result, there is the high possibility of damaging the magnetization fixed layer 35 due to oxidation, and of permitting the magnetic field of the magnetization fixed layer 35 to leak toward the magnetization free layer 37 to cause malfunction.

In the manufacturing method, the protective film and the lower electrode are intended to be continuously etched. In this case, large damage is added to the resist on the protective film for etching of the lower electrode. Thus, the inconveniences including peeling of the resist during etching of the lower electrode occur, which possibly results in the damage to the protective film as a lower layer. Thus, the lower electrode cannot be processed into a desired plan shape. As mentioned above, the manufacturing method of the comparative example possibly provides the semiconductor device 200 which makes it difficult to precisely suppress the variations in operation of the magnetoresistive elements 32.

It should be understood that the embodiments disclosed herein are illustrative and not limiting on all points. It is intended that the true scope of the present invention is indicated not by the above embodiments, but by the following claims, and that all variations can be made within equivalent means and scope to the scope of claims.

The invention provides an excellent semiconductor technology for suppressing the malfunction of semiconductor devices with magnetoresistive elements.

What is claimed is:

1. A semiconductor device, comprising:
   a semiconductor substrate;
   a lower electrode formed over a main surface of the semiconductor substrate;
   a magnetoresistive element including a fixed layer whose magnetization direction is fixed disposed over a main surface of the lower electrode, a tunneling insulating film disposed over a main surface of the fixed layer, a free layer whose magnetization direction is variable disposed over a main surface of the tunneling insulating film;
   an upper electrode disposed over a main surface of the free layer; and
   a protective film covering sides intersecting main surfaces of the lower electrode, the fixed layer, the tunneling insulating film, the free layer, and the upper electrode,
   wherein a width of the upper electrode is smaller than that of each of the lower electrode and the fixed layer in a direction intersecting a lamination direction of the lower electrode, the fixed layer, the tunneling insulating film, the free layer, and the upper electrode.

2. The semiconductor device according to claim 1, wherein the lower electrode has a laminated structure.

3. The semiconductor device according to claim 2, wherein at least one of the lower electrode and the upper electrode has the laminated structure having three or more layers.

4. The semiconductor device according to claim 1, wherein the upper electrode has a laminated structure.

5. The semiconductor device according to claim 1, wherein the lower electrode has a laminated structure, and the upper electrode has a laminated structure, and
   wherein the laminated structure of the lower electrode is the same as the laminated structure of the upper electrode.

6. The semiconductor device according to claim 1, wherein the lower electrode and the upper electrode comprise the same material.

7. The manufacturing method of a semiconductor device according to claim 1, wherein the step of forming the first conductive film involves laminating a plurality of layers,
   wherein the step of forming the second conductive film involves laminating a plurality of layers, and
   wherein in the step of forming the first conductive film and in the step of forming the second conductive film, the layers comprising the same material are laminated in the same order in a direction of lamination.

8. A manufacturing method of a semiconductor device, comprising the steps of:
   preparing a semiconductor substrate having a main surface;
   forming a first conductive film over the main surface of the semiconductor substrate;
   forming a first magnetic film over the first conductive film;
   forming an insulating film over the first magnetic film;
   forming a second magnetic film over the insulating film;
   forming a second conductive film over the second magnetic film;
   forming a lower electrode, a fixed layer, a tunneling insulating film, a free layer, and an upper electrode by respectively performing etching such that the first conductive film, the first magnetic film, the insulating film, the second magnetic film, and the second conductive film have respective desired shapes; and forming a protective film covering sides intersecting main surfaces of the lower electrode, the fixed layer, the tunneling insulating film, the free layer, and the upper electrode, wherein the step of etching includes the steps of:

etching the first conductive film, the first magnetic film, the insulating film, the second magnetic film, and the second conductive film such that the second conductive film has a planar shape of the lower electrode; and after the etching step, etching at least a part of the second conductive film and the second magnetic film such that the second conductive film has a planar shape smaller than a planar shape of the lower electrode.

9. The manufacturing method of a semiconductor device according to claim 8, wherein the step of forming the first conductive film involves laminating a plurality of layers.

10. The manufacturing method of a semiconductor device according to claim 9, wherein in at least one of the step of forming the first conductive film and the step of forming the second conductive film, three or more layers are laminated.

11. The manufacturing method of a semiconductor device according to claim 8, wherein the step of forming the second conductive film involves laminating a plurality of layers.

12. The manufacturing method of a semiconductor device according to claim 8, wherein the first conductive film and the second conductive film comprise the same material.

* * * * *